US012763282B2

(12) United States Patent
Wieland

(10) Patent No.: US 12,763,282 B2
(45) Date of Patent: Oct. 13, 2026

(54) CHARGED PARTICLE ASSESSMENT SYSTEM AND METHOD

(71) Applicant: ASML Netherlands B.V., Veldhoven (NL)

(72) Inventor: Marco Jan-Jaco Wieland, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 285 days.

(21) Appl. No.: 18/384,791

(22) Filed: Oct. 27, 2023

(65) Prior Publication Data

US 2024/0071716 A1 Feb. 29, 2024

Related U.S. Application Data

(63) Continuation of application No. PCT/EP2022/060298, filed on Apr. 19, 2022.

(30) Foreign Application Priority Data

Apr. 29, 2021 (EP) .................................... 21171331

(51) Int. Cl.
*H01J 37/22* (2006.01)
*H01J 37/20* (2006.01)
*H01J 37/244* (2006.01)

(52) U.S. Cl.
CPC ............ *H01J 37/226* (2013.01); *H01J 37/20* (2013.01); *H01J 37/244* (2013.01); *H01J 2237/2482* (2013.01)

(58) Field of Classification Search
CPC .. H01J 37/00; H01J 37/02; H01J 37/20; H01J 37/226; H01J 37/244; H01J 37/252;
(Continued)

(56) References Cited

U.S. PATENT DOCUMENTS 5,055,696 A 10/1991 Haraichi et al.
5,877,498 A * 3/1999 Sugimoto .......... G01N 23/2252 250/307
(Continued)

FOREIGN PATENT DOCUMENTS

TW 201642301 A 12/2016
TW 201643928 A 12/2016
(Continued)

OTHER PUBLICATIONS

International Search Report issued in related Foreign Application No. PCT/EP2022/060298, mailed Jul. 29, 2022 (3 pgs.).

*Primary Examiner* — Jason L McCormack
(74) *Attorney, Agent, or Firm* — FINNEGAN, HENDERSON, FARABOW, GARRETT & DUNNER, LLP

(57) ABSTRACT

The embodiments of the present disclosure provide a charged particle assessment system comprising: a sample holder configured to hold a sample having a surface; a charged particle-optical device configured to project a charged particle beam towards the sample, the charged particle beam having a field of view corresponding to a portion of the surface of the sample, the charged particle-optical device having a facing surface facing the sample holder; and a projection assembly arranged to direct a light beam along a light path such that the light beam reflects off the facing surface up-beam, with respect to the light path, of being incident on the portion of the surface of the sample.

19 Claims, 11 Drawing Sheets

(58) Field of Classification Search
CPC .......... H01J 37/26; H01J 37/28; H01J 37/228; H01J 2237/2482
USPC ................................. 250/306, 307, 310, 311
See application file for complete search history.

(56) References Cited

U.S. PATENT DOCUMENTS

| | | | | |
|---|---|---|---|---|
| 6,476,387 | B1 * | 11/2002 | Nishimura | H01J 37/28 850/16 |
| 7,675,034 | B2 | 3/2010 | Faber | |
| 10,679,820 | B2 | 6/2020 | Niu et al. | |
| 2007/0057184 | A1 * | 3/2007 | Uto | H01J 37/226 250/307 |
| 2011/0260055 | A1 | 10/2011 | Wang et al. | |
| 2016/0336146 | A1 * | 11/2016 | Goldenshtein | H01J 37/28 |
| 2020/0273662 | A1 | 8/2020 | Zhang et al. | |
| 2020/0294762 | A1 | 9/2020 | Zhang et al. | |

FOREIGN PATENT DOCUMENTS

| | | | |
|---|---|---|---|
| TW | 202113899 | A | 4/2021 |
| WO | WO 03/087797 | A1 | 10/2003 |
| WO | WO 2021/023752 | A1 | 2/2021 |

* cited by examiner

CHARGED PARTICLE ASSESSMENT SYSTEM AND METHOD

CROSS-REFERENCE TO RELATED APPLICATIONS

This application claims priority of International application PCT/EP2022/060298, filed on 19 Apr. 2022, which claims priority of EP application 21171331.8, filed on 29 Apr. 2021, all which are incorporated herein by reference in their entireties.

FIELD

The embodiments provided herein generally relate charged particle assessment systems and methods of operating charged particle assessment systems.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample. The intensity of the electron beams comprising the backscattered electrons and the secondary electrons may vary based on the properties of the internal and external structures of the sample, and thereby may indicate whether the sample has defects.

When the primary electron beam scans the sample, charges may be accumulated on the sample due to large beam current, which may affect the quality of the image. To regulate the accumulated charges on the sample, an Advanced Charge Controller (ACC) module may be employed to illuminate a light beam, such as a laser beam, on the sample, so as to control the accumulated charges due to effects such as photoconductivity, photoelectric, or thermal effects. It can be difficult to illuminate the light beam on the sample. For example, the dimensions of the pattern inspection tool may make it difficult to reach the sample with the light beam.

SUMMARY

It is an object of the present disclosure to provide embodiments that support illuminating the sample with a light beam for an ACC module.

According to some embodiments of the present disclosure, there is provided a charged particle assessment system comprising: a sample holder configured to hold a sample having a surface; a charged particle-optical device configured to project a charged particle beam towards the sample, the charged particle beam having a field of view corresponding to a portion of the surface of the sample, the charged particle-optical device having a facing surface facing the sample holder; and a projection assembly arranged to direct a light beam along a light path such that the light beam reflects at least twice off the facing surface up-beam, with respect to the light path, of being incident on the portion of the surface of the sample.

According to some embodiments of the present disclosure, there is provided a method of operating a charged particle assessment system, comprising: holding a sample in a sample holder; projecting a charged particle beam towards the sample using a charged particle-optical device, the charged particle beam having a field of view corresponding to a portion of a surface of the sample, the charged particle-optical device having a facing surface facing the sample; and directing a light beam along a light path using a projection assembly such that the light beam reflects at least twice off the facing surface up-beam, with respect to the light path, of being incident on the portion.

BRIEF DESCRIPTION OF FIGURES

The above and other aspects of the present disclosure will become more apparent from the description of exemplary embodiments, taken in conjunction with the accompanying drawings.

Figure 1:
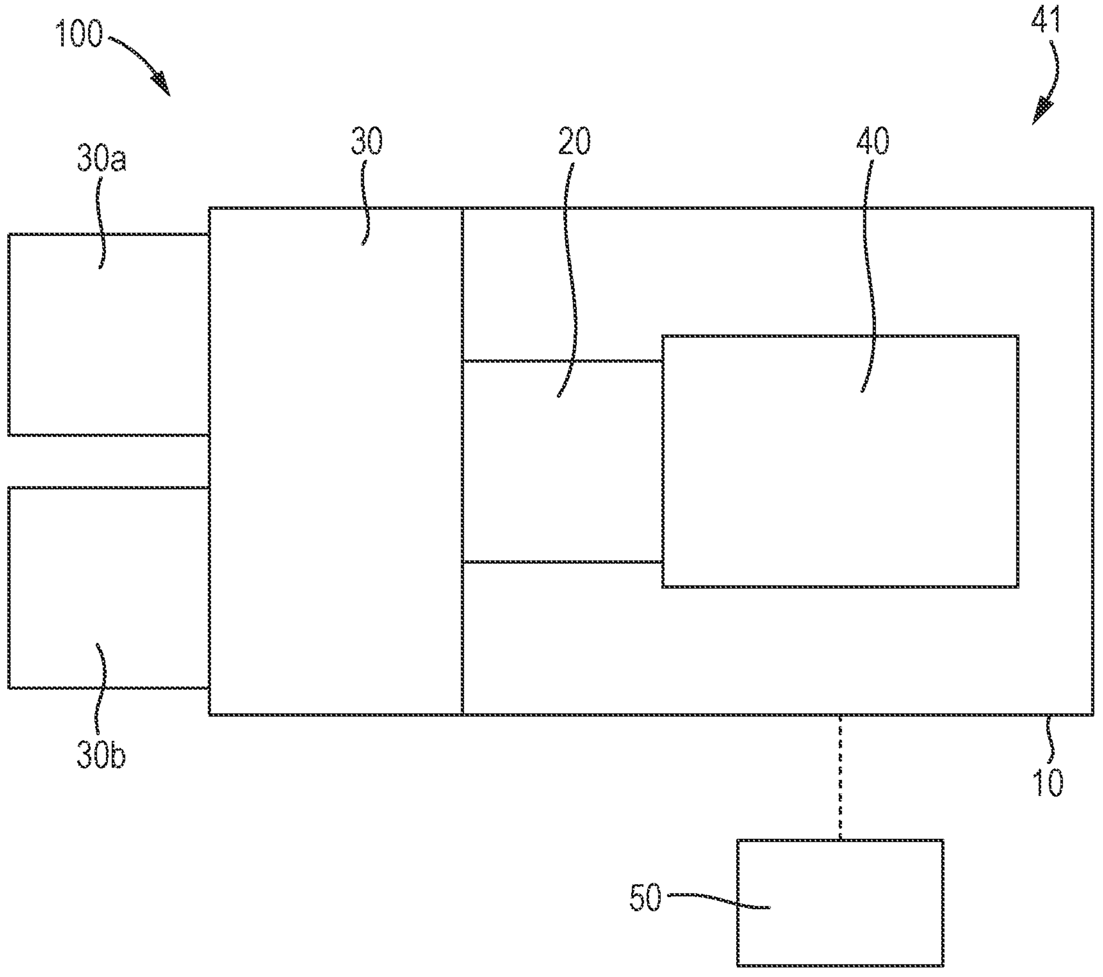
FIG. 1 is a schematic diagram illustrating an exemplary electron beam inspection apparatus.

The schematic diagrams and views show the components described below. However, the components depicted in the figures are not to scale.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially true if operator intervention is required for reviewing the defects. Thus, high throughput detection and identification of micro and nano-scale defects by inspection tools (such as a Scanning Electron Microscope (SEW)) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical system, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, a charged particle assessment system (which may also be called an electron beam system or tool), an equipment front end module (EFEM) 30 and a controller 50. The charged particle assessment system 40 is located within the main chamber 10.

The EFEM 30 includes a first loading port 30*a* and a second loading port 30*b*. The EFEM 30 may include additional loading port(s). The first loading port 30*a* and the second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in the EFEM 30 transport the samples to the load lock chamber 20.

The load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from the load lock chamber to the main chamber 10. The main chamber 10 is connected to a main chamber vacuum pump system (not shown). The main chamber vacuum pump system removes gas particles in the main chamber 10 so that the pressure in around the sample reaches a second pressure lower than the first pressure. After reaching the second pressure, the sample is transported to the charged particle assessment system 40 by which it may be inspected. The charged particle assessment system 40 comprises an electron-optical system 41. The electron-optical system 41 comprises an electron-optical device configured to project at least one electron beam towards the sample. The electron-optical device may form the most down-beam part of the electron-optical system 41. The electron-optical system 41 may be a multi-beam electron-optical system 41 configured to project a multi-beam towards the sample. Alternatively, the electron-optical system 41 may be a single beam electron-optical system 41 configured to project a single beam towards the sample.

The controller 50 is electronically connected to the charged particle assessment system 40. The controller 50 may be a processor (such as a computer) configured to control the charged particle beam inspection apparatus 100. The controller 50 may also include a processing circuitry configured to execute various signal and image processing functions. While the controller 50 is shown in FIG. 1 as being outside of the structure that includes the main chamber 10, the load lock chamber 20, and the EFEM 30, it is appreciated that the controller 50 may be part of the structure. The controller 50 may be located in one of the component elements of the charged particle beam inspection apparatus or it can be distributed over at least two of the component elements. While the present disclosure provides examples of the main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
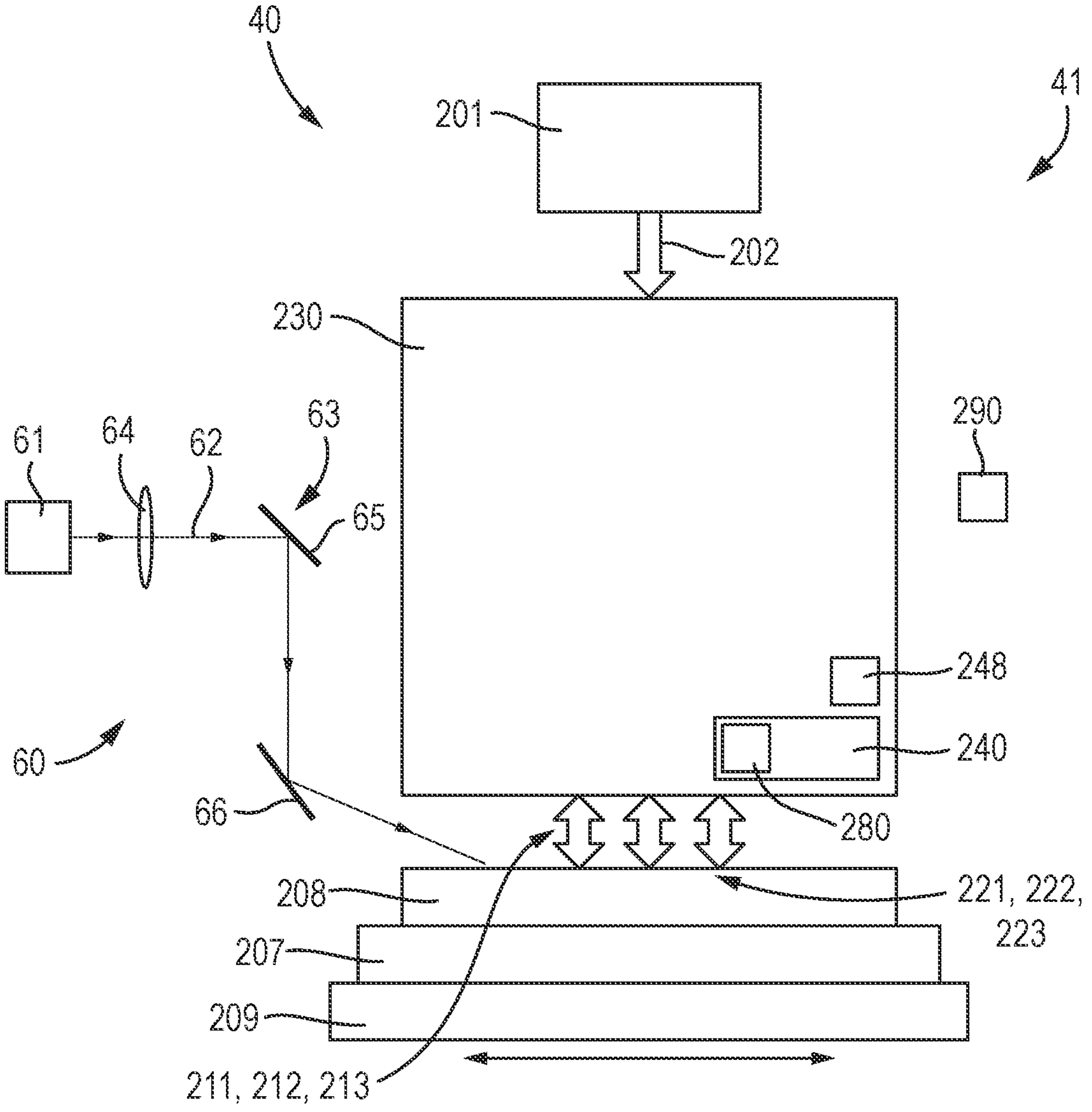
FIG. 2 is a schematic diagram illustrating an exemplary multi-beam charged particle assessment system that is part of the exemplary electron beam inspection apparatus of FIG. 1.

Reference is now made to FIG. 2, which is a schematic diagram illustrating an exemplary charged particle assessment system 40 including a multi-beam electron-optical system 41 that is part of the exemplary charged particle beam inspection apparatus 100 of FIG. 1. The multi-beam electron-optical system 41 comprises an electron source 201 and a projection apparatus 230. The charged particle assessment system 40 further comprises a motorized stage 209 and a sample holder 207. The electron source 201 and projection apparatus 230 may together be referred to as the electron-optical system 41. The sample holder 207 is supported by motorized stage 209 so as to hold a sample 208 (e.g., a substrate or a mask) for inspection. The multi-beam electron-optical system 41 further comprises a detector 240 (e.g. an electron detection device).

The electron source 201 may comprise a cathode (not shown) and an extractor or anode (not shown). During operation, the electron source 201 is configured to emit electrons as primary electrons from the cathode. The primary electrons are extracted or accelerated by the extractor and/or the anode to form a primary electron beam 202.

The projection apparatus 230 is configured to convert the primary electron beam 202 into a plurality of sub-beams 211, 212, 213 and to direct each sub-beam onto the sample 208. Although three sub-beams are illustrated for simplicity, there may be many tens, many hundreds or many thousands of sub-beams. The sub-beams may be referred to as beamlets.

The controller 50 may be connected to various parts of the charged particle beam inspection apparatus 100 of FIG. 1, such as the electron source 201, the detector 240, the projection apparatus 230, and the motorized stage 209. The controller 50 may perform various image and signal processing functions. The controller 50 may also generate various control signals to govern operations of the charged particle beam inspection apparatus, including the charged particle multi-beam apparatus.

The projection apparatus 230 may be configured to focus sub-beams 211, 212, and 213 onto a sample 208 for inspection and may form three probe spots 221, 222, and 223 on the surface of sample 208. The projection apparatus 230 may be configured to deflect the primary sub-beams 211, 212, and 213 to scan the probe spots 221, 222, and 223 across individual scanning areas in a section of the surface of the sample 208. In response to incidence of the primary sub-beams 211, 212, and 213 on the probe spots 221, 222, and 223 on the sample 208, electrons are generated from the sample 208 which include secondary electrons and backscattered electrons. The secondary electrons typically have electron energy≤50 eV. Actual secondary electrons can have an energy of less than 5 eV, but anything beneath 50 eV is generally treated at a secondary electron. Backscattered electrons typically have electron energy between 0 eV and the landing energy of the primary sub-beams 211, 212, and 213. As electrons detected with an energy of less than 50 eV is generally treated as a secondary electron, a proportion of the actual backscatter electrons will be counted as secondary electrons.

The detector 240 is configured to detect signal particles such as secondary electrons and/or backscattered electrons and to generate corresponding signals which are sent to a signal processing system 280, e.g. to construct images of the corresponding scanned areas of sample 208. The detector 240 may be incorporated into the projection apparatus 230.

The signal processing system 280 may comprise a circuit (not shown) configured to process signals from the detector 240 so as to form an image. The signal processing system 280 could otherwise be referred to as an image processing system. The signal processing system may be incorporated into a component of the multi-beam charged particle assessment system 40 such as the detector 240 (as shown in FIG. 2). However, the signal processing system 280 may be incorporated into any components of the inspection apparatus 100 or multi-beam charged particle assessment system 40, such as, as part of the projection apparatus 230 or the controller 50. The signal processing system 280 may include an image acquirer (not shown) and a storage device (not shown). For example, the signal processing system may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to the detector 240 permitting signal communication, such as an electrical conductor, optical fiber cable, portable storage media, IR, Bluetooth, internet, wireless network, wireless radio, among others, or a combination thereof. The image acquirer may receive a signal from the detector 240, may process the data comprised in the signal and may construct an image therefrom. The image acquirer may thus acquire images of the sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The signal processing system 280 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of the sample 208. The reconstructed images can thereby be used to reveal any defects that may exist in the sample.

The controller 50 may control the motorized stage 209 to move sample 208 during inspection of the sample 208. The controller 50 may enable the motorized stage 209 to move the sample 208 in a direction, preferably continuously, for example at a constant speed, at least during sample inspection. The controller 50 may control movement of the motorized stage 209 so that it changes the speed of the movement of the sample 208 dependent on various parameters. For example, the controller 50 may control the stage speed (including its direction) depending on the characteristics of the inspection steps of scanning process.

Known multi-beam systems, such as the charged particle assessment system 40 and charged particle beam inspection apparatus 100 described above, are disclosed in US2020118784, US20200203116, US 2019/0259570 and US2019/0259564 which are hereby incorporated by reference.

As shown in FIG. 2, in some embodiments, the charged particle assessment system 40 comprises a projection assembly 60. The projection assembly 60 may be a module and may be referred to as an ACC module. The projection assembly 60 is arranged to direct a light beam 62 such that the light beam 62 enters between the electron-optical system 41 and the sample 208.

When the electron beam scans the sample 208, charges may be accumulated on the sample 208 due to large beam current, which may affect the quality of the image. To regulate the accumulated charges on the sample, the projection assembly 60 may be employed to illuminate the light beam 62 on the sample 208, so as to control the accumulated charges due to effects such as photoconductivity, photoelectric, or thermal effects. The projection assembly 60 will be described in more detail below with reference to FIG. 13 and FIG. 14.

Components of a charged particle assessment system 40 that may be used in the are described below in relation to FIG. 3 which is a schematic diagram of a charged particle assessment system 40. The charged particle assessment system 40 of FIG. 3 may correspond to the charged particle assessment system 40 (which may also be referred to as an apparatus or a tool) mentioned above.

The electron source 201 directs electrodes toward an array of condenser lenses 231 (otherwise referred to as a condenser lens array). The electron source 201 is desirably a high brightness thermal field emitter with a good compromise between brightness and total emission current. There may be many tens, many hundreds or many thousands of condenser lenses 231. The condenser lenses 231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The array of condenser lenses 231 may take the form of at least two plates, acting as electrodes, with an aperture in each plate aligned with each other and corresponding to the location of a sub-beam. At least two of the plates are maintained during operation at different potentials to achieve the desired lensing effect.

In an arrangement the array of condenser lenses 231 is formed of three plate arrays in which charged particles have the same energy as they enter and leave each lens, which arrangement may be referred to as an Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect.

Each condenser lens 231 in the array directs electrons into a respective sub-beam 211, 212, 213 which is focused at a respective intermediate focus down beam of the condenser lens array. The sub-beams diverge with respect to each other. In some embodiments, deflectors 235 are provided at the intermediate focuses. The deflectors 235 are positioned in the sub-beam paths at, or at least around, the position of the corresponding intermediate points of focus. The deflectors 235 are positioned in or close to the sub-beam paths at the intermediate image plane of the associated sub-beam. The deflectors 235 are configured to operate on the respective sub-beams 211, 212, 213. The deflectors 235 are configured to bend a respective sub-beam 211, 212, 213 by an amount effective to ensure that the principal ray (which may also be referred to as the beam axis) is incident on the sample 208 substantially normally (i.e. at substantially 90° to the nominal surface of the sample). The deflectors 235 may also be referred to as collimators or collimator deflectors. The deflectors 235 in effect collimate the paths of the sub-beams so that before the deflectors, the sub-beam paths with respect to each other are diverging. Down beam of the deflectors the sub-beam paths are substantially parallel with respect to each other, i.e. substantially collimated. Suitable collimators are deflectors disclosed in EP Application 20156253.5 filed on 7 Feb. 2020 which is hereby incorporated by reference with respect to the application of the deflectors to a multi-beam array. The collimator may comprise a macro collimator 270 (e.g. as shown in FIG. 4), instead of, or in addition to the deflectors 235. Thus, the macro-collimator 270 described below in relation to FIG. 4 may be provided with the features of FIG. 3. This is generally less preferred than providing the collimator array as deflectors 235.

Below (i.e. down beam or further from source 201) the deflectors 235 there is a control lens array 250. The sub-beams 211, 212, 213 having passed through the deflectors 235 are substantially parallel on entry to the control lens array 250. The control lenses pre-focus the sub-beams (e.g. apply a focusing action to the sub-beams prior to the sub-beams reaching the objective lens array 241). The pre-focusing may reduce divergence of the sub-beams or increase a rate of convergence of the sub-beams. The control lens array 250 and the objective lens array 241 operate together to provide a combined focal length. Combined operation without an intermediate focus may reduce the risk of aberrations.

In further detail, it is desirable to use the control lens array 250 to determine the landing energy. However, it is possible to use in addition the objective lens array 241 to control the landing energy. In such a case, a potential difference over the objective lens is changed when a different landing energy is selected. One example of a situation where it is desirable to partly change the landing energy by changing the potential difference over the objective lens is to prevent the focus of the sub-beams getting too close to the objective lenses. In such a situation there is a risk of components of the objective lens array 241 having to be too thin to be manufacturable. The same may be said about a detector at this location. This situation can for example occur in case the landing energy is lowered. This is because the focal length of the objective lens roughly scales with the landing energy used. By lowering the potential difference over the objective lens, and thereby lowering the electric field inside the objective lens, the focal length of the objective lens is made larger again, resulting in a focus position further below the objective lens. Note that use of just an objective lens would limit control of magnification. Such an arrangement could not control demagnification and/or opening angle. Further, using the objective lens to control the landing energy could mean that the objective lens would be operating away from its optimal field strength. That is unless mechanical parameters of the objective lens (such as the spacing between its electrodes) could be adjusted, for example by exchanging the objective lens.

The control lens array 250 comprises a plurality of control lenses. Each control lens comprises at least two electrodes (e.g. two or three electrodes) connected to respective potential sources. The control lens array 250 may comprise two or more (e.g. three) plate electrode arrays connected to respective potential sources. The control lens array 250 is associated with the objective lens array 241 (e.g. the two arrays are positioned close to each other and/or mechanically connected to each other and/or controlled together as a unit). Each control lens may be associated with a respective objective lens. The control lens array 250 is positioned up-beam of the objective lens array 241.

The control lens array 250 comprises a control lens for each sub-beam 211, 212, 213. A function of the control lens array 250 is to optimize the beam opening angle with respect to the demagnification of the beam and/or to control the beam energy delivered to the objective lens array 241 which directs the sub-beams 211, 212, 213 onto the sample 208. The objective lens array 241 may be positioned at or near the base of the electron-optical system 41. The control lens array 250 is optional, but is preferred for optimizing a sub-beam upbeam of the objective lens array.

Figure 3:
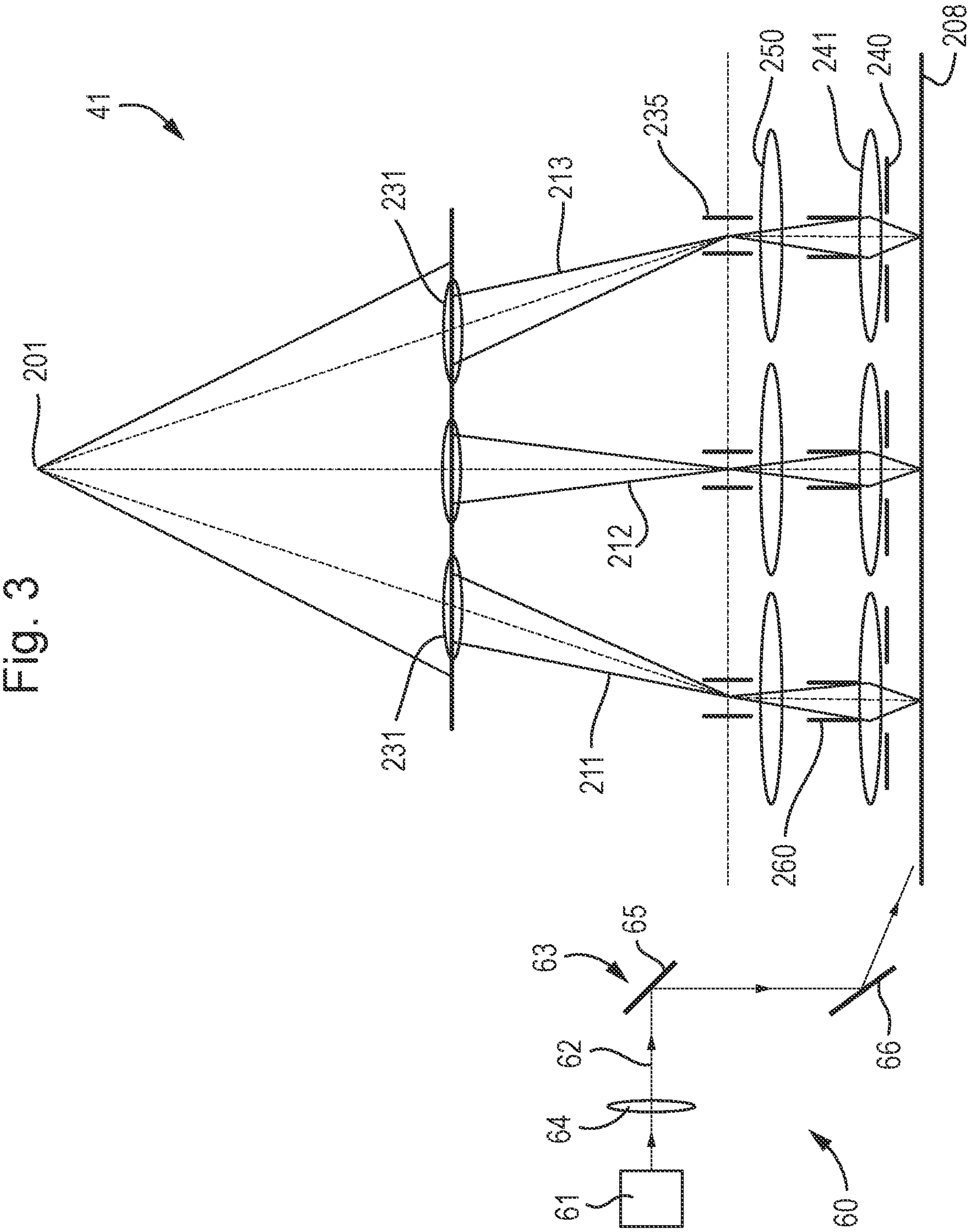
FIG. 3 is a schematic diagram of an exemplary multi-beam charged particle assessment system according to some embodiments of the present disclosure.
Figure 4:
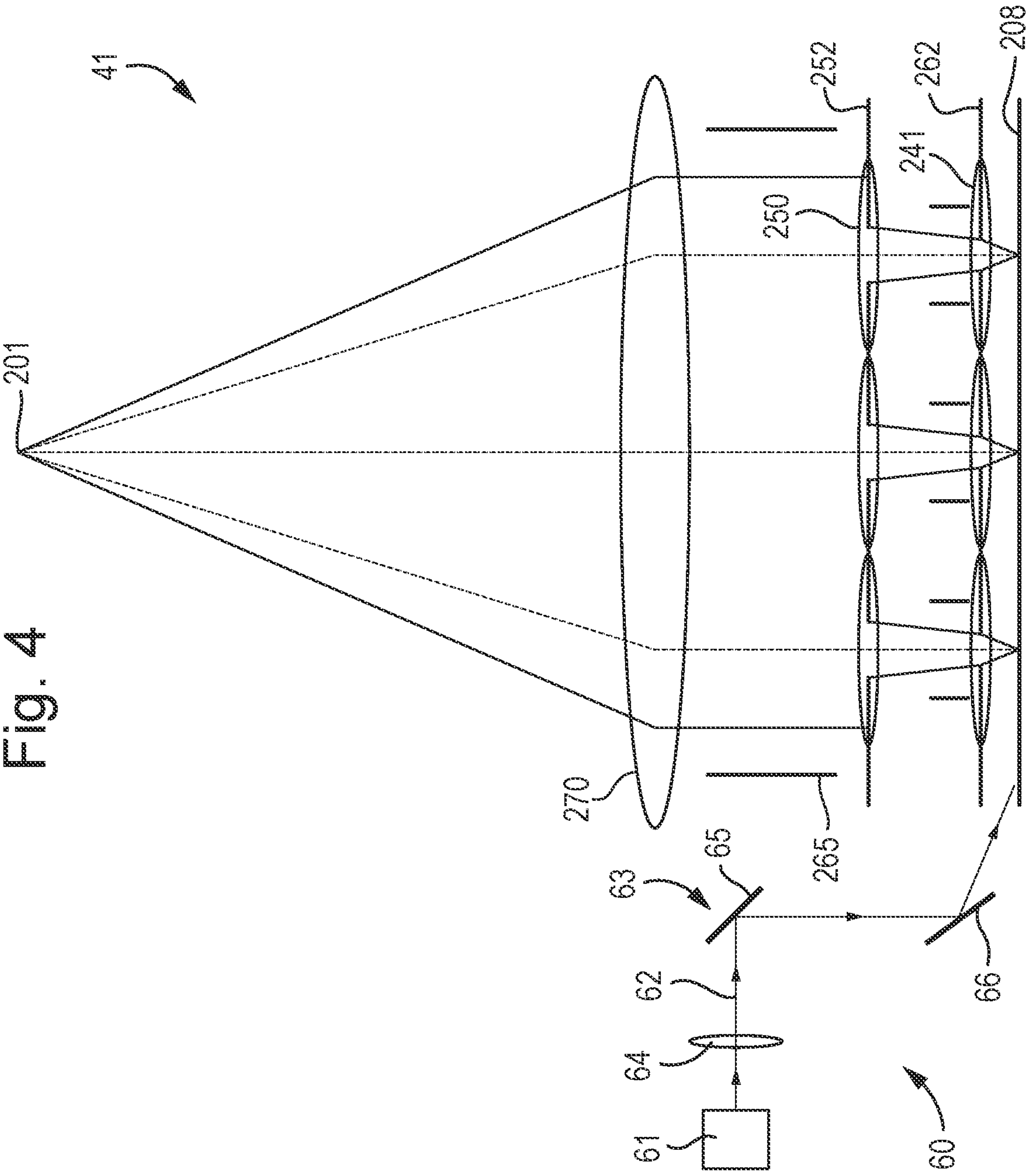
FIG. 4 is a schematic diagram of an exemplary charged particle assessment system comprising a macro collimator and macro scan deflector.

For ease of illustration, lens arrays are depicted schematically herein by arrays of oval shapes (as shown in FIG. 3). Each oval shape represents one of the lenses in the lens array. The oval shape is used by convention to represent a lens, by analogy to the biconvex form often adopted in optical lenses. In the context of charged-particle arrangements such as those discussed herein, it will be understood however that lens arrays will typically operate electrostatically and so may not require any physical elements adopting a biconvex shape. Lens arrays may instead comprise multiple plates with apertures.

Optionally, an array of scan deflectors 260 is provided between the control lens array 250 and the array of objective lenses 234. The array of scan deflectors 260 comprises a scan deflector for each sub-beam 211, 212, 213. Each scan deflector is configured to deflect a respective sub-beam 211, 212, 213 in one or two directions so as to scan the sub beam across the sample 208 in one or two directions.

FIG. 4 is a schematic diagram of an exemplary charged particle assessment system 40 having an alternative electron-optical system 41. The electron-optical system 41 comprises an objective lens array 241. The objective lens array 241 comprises a plurality of objective lenses. The objective lens array 241 may be an exchangeable module. For conciseness, features of the objective lens array 241 that have already been described above may not be repeated here.

The electron-optical device 41 can be used for the detection of electrons in the system of FIG. 4. As shown in FIG. 4, the electron-optical system 41 comprises a source 201. The source 201 provides a beam of charged particles (e.g. electrons). The multi-beam focused on the sample 208 is derived from the beam provided by the source 201. Sub-beams may be derived from the beam, for example, using a beam limiter defining an array of beam-limiting apertures. The beam may separate into the sub-beams on meeting the control lens array 250. The sub-beams are substantially parallel on entry to the control lens array 250. The source 201 is desirably a high brightness thermal field emitter with a good compromise between brightness and total emission current. In the example shown, a collimator is provided up-beam of the objective lens array assembly. The collimator may comprise a macro collimator 270. The macro collimator 270 acts on the beam from the source 201 before the beam has been split into a multi-beam. The macro collimator 270 bends respective portions of the beam by an amount effective to ensure that a beam axis of each of the sub-beams derived from the beam is incident on the sample 208 substantially normally (i.e. at substantially 90° to the nominal surface of the sample 208). The macro collimator 270 applies a macroscopic collimation to the beam. The macro collimator 270 may thus act on all of the beam rather than comprising an array of collimator elements that are each configured to act on a different individual portion of the beam. The macro collimator 270 may comprise a magnetic lens or magnetic lens arrangement comprising a plurality of magnetic lens sub-units (e.g. a plurality of electromagnets forming a multi-pole arrangement). Alternatively or additionally, the macro-collimator may be at least partially implemented electrostatically. The macro-collimator may comprise an electrostatic lens or electrostatic lens arrangement comprising a plurality of electrostatic lens sub-units. The macro collimator 270 may use a combination of magnetic and electrostatic lenses.

In another arrangement (not shown), the macro-collimator may be partially or wholly replaced by a collimator element array provided down-beam of the upper beam limiter. Each collimator element collimates a respective sub-beam. The collimator element array may be formed using MEMS manufacturing techniques so as to be spatially compact. The collimator element array may be the first deflecting or focusing electron-optical array element in the beam path down-beam of the source 201. The collimator element array may be up beam of the control lens array 250. The collimator element array may be in the same module as the control lens array 250.

In the example of FIG. 4 a macro scan deflector 265 is provided to cause sub-beams to be scanned over the sample 208. The macro scan deflector 265 deflects respective portions of the beam to cause the sub-beams to be scanned over the sample 208. In some embodiments, the macro scan deflector 265 comprises a macroscopic multi-pole deflector, for example with eight poles or more. The deflection is such as to cause sub-beams derived from the beam to be scanned across the sample 208 in one direction (e.g. parallel to a single axis, such as an X axis) or in two directions (e.g. relative to two non-parallel axes, such as X and Y axes). The macro scan deflector 265 acts macroscopically on all of the beam rather than comprising an array of deflector elements that are each configured to act on a different individual portion of the beam. In the example shown, the macro scan deflector 265 is provided between the macro collimator 270 and the control lens array 250.

In another arrangement (not shown), the macro scan deflector 265 may be partially or wholly replaced by a scan deflector array. The scan-deflector array comprises a plurality of scan deflectors. The scan-deflector array may be formed using MEMS manufacturing techniques. Each scan deflector scans a respective sub-beam over the sample 208. The scan-deflector array may thus comprise a scan deflector for each sub-beam. Each scan deflector may deflect the sub-beam in one direction (e.g. parallel to a single axis, such as an X axis) or in two directions (e.g. relative to two non-parallel axes, such as X and Y axes). The deflection is such as to cause the sub-beam to be scanned across the sample 208 in the one or two directions (i.e. one dimensionally or two dimensionally). The scan deflector array may be up beam of an objective lens array 241. The scan deflector array may be down beam of a control lens array 250. Although reference is made to a single sub-beam associated with a scan deflector, groups of sub-beams may be associated with a scan deflector. In some embodiments, the scanning deflectors described in EP2425444, which document is hereby incorporated by reference in its entirety specifically in relation to scan deflectors, may be used to implement the scan-deflector array. A scan-deflector array (e.g. formed using MEMS manufacturing techniques as mentioned above) may be more spatially compact than a macro scan deflector. The scan deflector array may be in the same module as the objective lens array 241.

In other embodiments both a macro scan deflector 265 and the scan-deflector array are provided. In such an arrangement, the scanning of the sub-beams over the sample surface may be achieved by controlling the macro scan deflector and the scan-deflector array together, preferably in synchronization.

In some embodiments, the electron-optical system 41 further comprises an upper beam limiter 252. The upper beam limiter 252 defines an array of beam-limiting apertures. The upper beam limiter 252 may be referred to as an upper beam-limiting aperture array or up-beam beam-limiting aperture array. The upper beam limiter 252 may comprise a plate (which may be a plate-like body) having a plurality of apertures. The upper beam limiter 252 forms sub-beams from a beam of charged particles emitted by the source 201. Portions of the beam other than those contributing to forming the sub-beams may be blocked (e.g. absorbed) by the upper beam limiter 252 so as not to interfere with the sub-beams down-beam. The upper beam limiter 252 may be referred to as a sub-beam defining aperture array.

In some embodiments, as exemplified in FIG. 4, the objective lens array assembly (which is a unit that comprises the objective lens array 241) further comprises a beam shaping limiter 262. The beam shaping limiter 262 defines an array of beam-limiting apertures. The beam shaping limiter 262 may be referred to as a lower beam limiter, lower beam-limiting aperture array or final beam-limiting aperture array. The beam shaping limiter 262 may comprise a plate (which may be a plate-like body) having a plurality of apertures. The beam shaping limiter 262 may be down-beam from at least one electrode (optionally from all electrodes) of the control lens array 250. In some embodiments, the beam shaping limiter 262 is down-beam from at least one electrode (optionally from all electrodes) of the objective lens array 241.

In an arrangement, the beam shaping limiter 262 is structurally integrated with an electrode of the objective lens array 241. Desirably, the beam shaping limiter 262 is positioned in a region of low electrostatic field strength. Each of the beam-limiting apertures is aligned with a corresponding objective lens in the objective lens array 241. The alignment is such that a portion of a sub-beam from the corresponding objective lens can pass through the beam-limiting aperture and impinge onto the sample 208. Each beam-limiting aperture has a beam limiting effect, allowing only a selected portion of the sub-beam incident onto the beam shaping limiter 262 to pass through the beam-limiting aperture. The selected portion may be such that only a portion of the respective sub-beam passing through a central portion of respective apertures in the objective lens array reaches the sample. The central portion may have a circular cross-section and/or be centered on a beam axis of the sub-beam.

Any of the objective lens array assemblies described herein may further comprise a detector 240. The detector detects electrons emitted from the sample 208. The detected electrons may include any of the electrons detected by an SEM, including secondary and/or backscattered electrons emitted from the sample 208. An exemplary construction of a detector 240 is shown in FIG. 3 and described in more detail below with reference to FIGS. 7-10.

Figure 5:
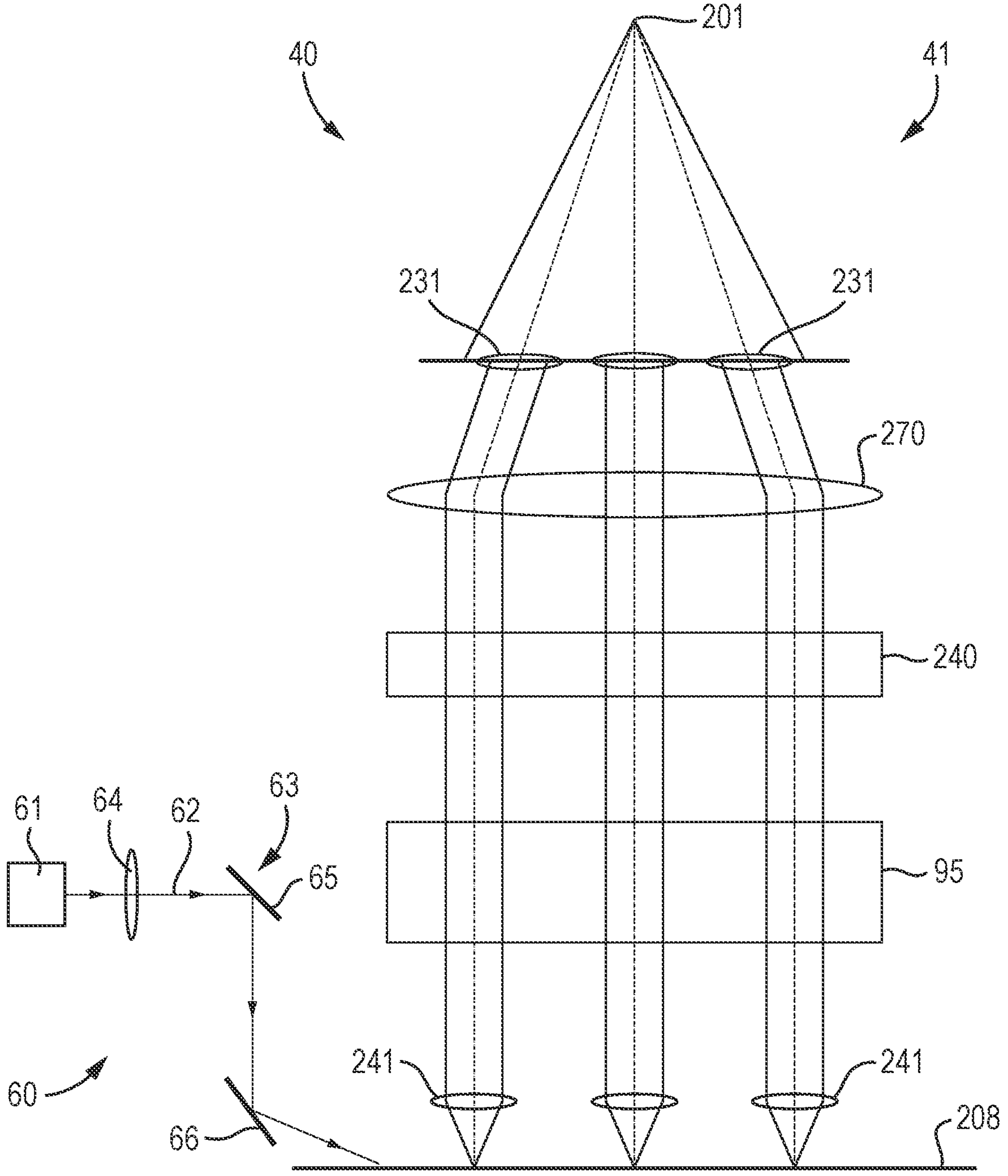
FIG. 5 is a schematic diagram of an exemplary multi-beam charged particle assessment system according to some embodiments of the present disclosure.

FIG. 5 schematically depicts a charged particle assessment system 40 according to some embodiments. Features that are the same as those described above are given the same reference numerals. For conciseness, such features are not described in detail with reference to FIG. 5. For example, the source 201, the condenser lenses 231, the macro collimator 270, the objective lens array 241 and the sample 208 may be as described above.

As described above, in some embodiments, the detector 240 is between the objective lens array 241 and the sample 208. The detector 240 may face the sample 208. Alternatively, as shown in FIG. 5, in some embodiments, the objective lens array 241, which comprises the plurality of objective lenses, is between the detector 240 and the sample 208.

In some embodiments, a deflector array 95 is between the detector 240 and the objective lens array 241. In some embodiments, the deflector array 95 comprises a Wien filter so that deflector array may be referred to as a beam separator. The deflector array 95 is configured to provide a magnetic field to disentangle the charged particles projected to the sample 208 from the secondary electrons from the sample 208.

In some embodiments, the detector 240 is configured to detect signal particles by reference to the energy of the charged particle, i.e. dependent on a band gap. Such a detector 240 may be called an indirect current detector. The secondary electrons emitted from the sample 208 gain energy from the fields between the electrodes. The secondary electrodes have sufficient energy once they reach the detector 240.

Figure 6:
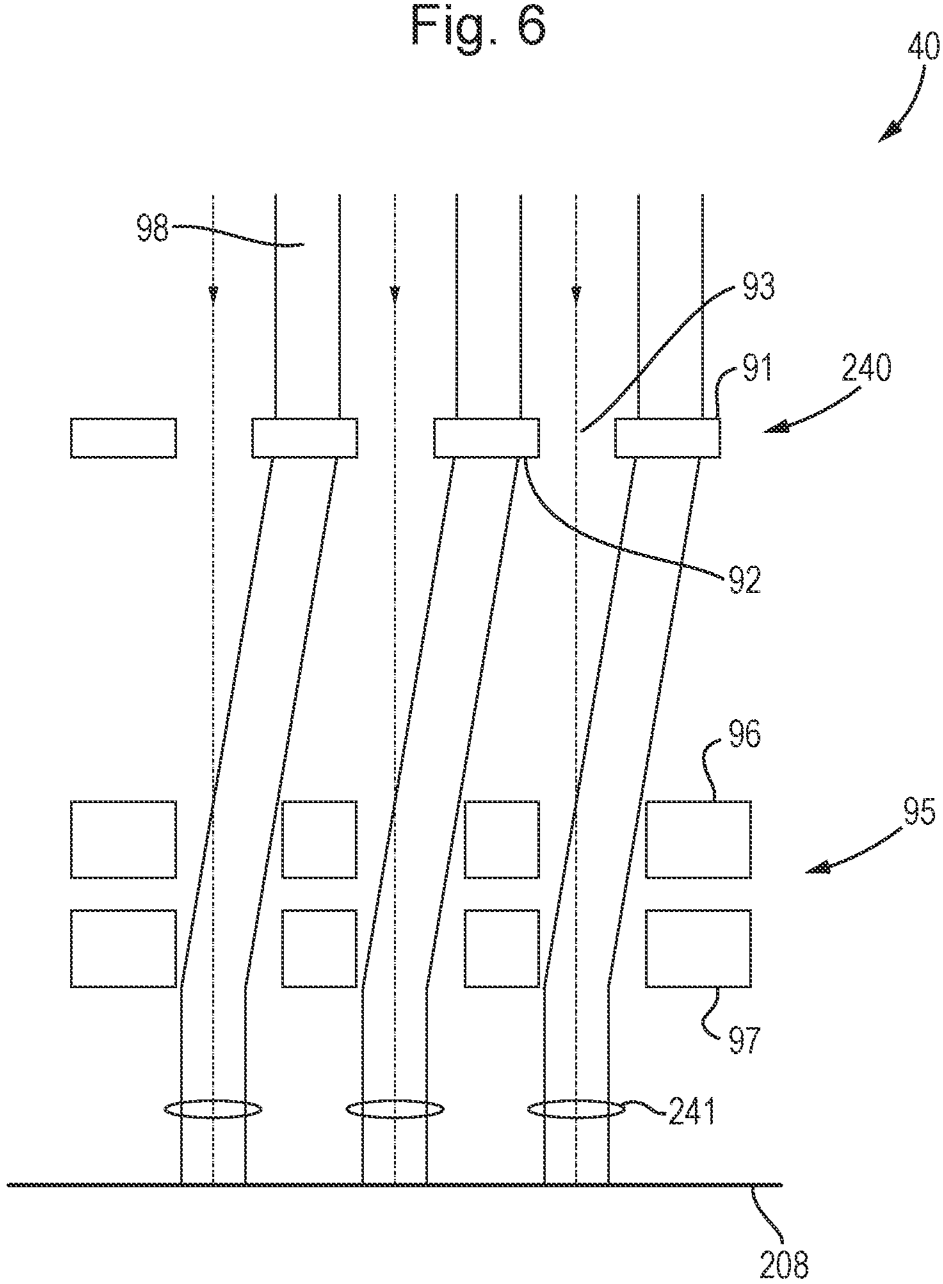
FIG. 6 is a schematic diagram of part of the multi-beam charged particle assessment system of FIG. 5.

FIG. 6 is a close-up view of part of the charged particle assessment system 40 shown in FIG. 5. In some embodiments, the detector 240 comprises an electron to photon converter array 91. The electron to photon converter array 91 comprises a plurality of fluorescent strips 92. Each fluorescent strip 92 is located in the plane of the electron to photon converter array 91. At least one fluorescent strip 92 is arranged between two adjacent charged particle beams projected towards the sample 208.

In some embodiments, the fluorescent strips 92 extend substantially in the horizontal direction. Alternatively, the electron to photon converter array 91 may comprise a plate of a fluorescent material with openings 93 for the projected charged particle beams.

The projected charged particle beams, indicated by dashed lines in FIG. 6, are projected through the plane of the electron to photon converter array 91, via the openings 93 between the fluorescent strips 92, towards the deflector array 95.

In some embodiments, the deflector array 95 comprises a magnetic deflector 96 and an electrostatic deflector 97. The electrostatic deflector 97 is configured to counteract the deflection of the magnetic deflector 96 for the projected charged particle beams transmitted towards the sample 208. Accordingly, the projected charged particle beams may be shifted to a small extent in the horizontal plane. The beams down-beam of the deflector array 95 are substantially parallel to the beams up-beam of the deflector array 95.

In some embodiments, the objective lens array 241 comprises a plurality of plates for guiding secondary electrons created in the sample 208 towards the deflector array 95. For the secondary electrons, which travel in opposite direction with respect to the projected charged particle beams, the electrostatic deflector 97 does not counteract the deflection of the magnetic deflector 96. Instead, the deflections of the secondary electrons by the electrostatic deflector 97 and the magnetic deflector 96 add up. Accordingly, the secondary electrons are deflected to travel at an angle with respect to the optical axis in order to transmit the secondary electrons onto the fluorescent strips 92 of the detector 240.

At the fluorescent strips 92, photons are created upon incidence of the secondary electrons. In some embodiments, the photons are transported from the fluorescent strip 92 to a photo detector (not shown) via a photon transport unit. In some embodiments, the photon transport unit comprises an array of optical fibers 98. Each optical fiber 98 comprises an end which is arranged adjacent or attached to one of the fluorescent strips 92 for coupling photons from the fluorescent strip 92 into the optical fiber 98, and another end which is arranged to project photons from the optical fiber 98 onto the photo detector.

Figure 7:
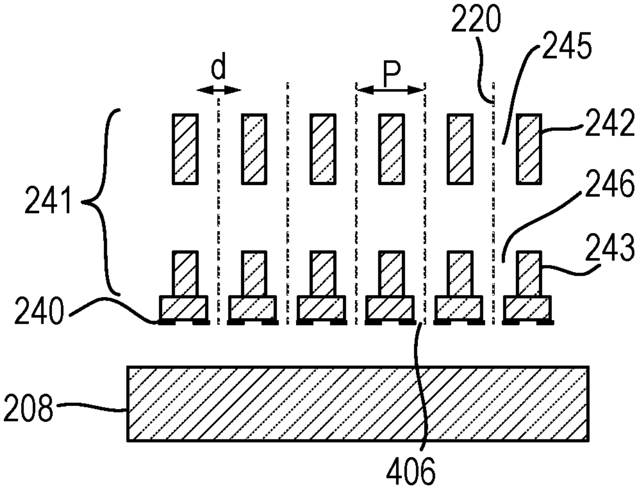
FIG. 7 is a schematic cross-sectional view of an objective lens array of a charged particle assessment system according to some embodiments of the present disclosure.

The objective lens array 241 may comprise at least two electrodes in which are defined aperture arrays. In other words, the objective lens array comprises at least two electrodes with a plurality of holes or apertures. FIG. 7 shows electrodes 242, 243 which are part of an exemplary objective lens array 241 having respective aperture arrays 245, 246. The position of each aperture in an electrode corresponds to the position of a corresponding aperture in another electrode. The corresponding apertures operate in use on the same beam, sub-beam or group of beams in the multi-beam. In other words, corresponding apertures in the at least two electrodes are aligned with and arranged along a sub-beam path, i.e. one of the sub-beam paths 220. Thus, the electrodes are each provided with apertures through which the respective sub-beam 211, 212, 213 propagates.

The objective lens array 241 may comprise two electrodes, as shown in FIG. 7, or three electrodes, or may have more electrodes (not shown). An objective lens array 241 having only two electrodes can have lower aberration than an objective lens array 241 having more electrodes. A three-electrode objective lens can have greater potential differences between the electrodes and so enable a stronger lens. Additional electrodes (i.e. more than two electrodes) provide additional degrees of freedom for controlling the electron trajectories, e.g. to focus secondary electrons as well as the incident beam. A benefit of two electrode lens over an Einzel lens is that the energy of an in-coming beam is not necessarily the same as an out-going beam. Beneficially the potential differences on such a two electrode lens array enables it to function as either an accelerating or a decelerating lens array.

Adjacent electrodes of the objective lens array 241 are spaced apart from each other along the sub-beam paths. The distance between adjacent electrodes, in which an insulating structure might be positioned as described below, is larger than the objective lens.

Preferably, each of the electrodes provided in the objective lens array 241 is a plate. The electrode may otherwise be described as a flat sheet. Preferably, each of the electrodes is planar. In other words, each of the electrodes will preferably be provided as a thin, flat plate, in the form of a plane. Of course, the electrodes are not required to be planar. For example, the electrode may bow due to the force due to the high electrostatic field. It is preferable to provide a planar electrode because this makes manufacturing of the electrodes easier as known fabrication methods can be used. Planar electrodes may also be preferable as they may provide more accurate alignment of apertures between different electrodes.

The objective lens array 241 can be configured to demagnify the charged particle beam by a factor greater than 10, desirably in the range of 50 to 100 or more.

A detector 240 is provided to detect secondary and/or backscattered charged particles emitted from the sample 208. The detector 240 is positioned between the objective lenses 234 and the sample 208. The detector 240 may otherwise be referred to as a detector array or a sensor array, and the terms "detector" and "sensor" are used interchangeably throughout the application.

An electron-optical device for the electron-optical system 41 may be provided. The electron-optical device is configured to project a beam of electrons towards the sample 208. The electron-optical device may comprise the objective lens array 241. The electron-optical device may comprise the detector 240. The array of objective lenses (i.e. the objective lens array 241) may correspond with the array of detectors (i.e. the detector 240) and/or any of the beams (i.e. the sub-beams).

An exemplary detector 240 is described below. However, any reference to the detector 240 could be a single detector (i.e. at least one detector) or multiple detectors as appropriate. The detector 240 may comprise detector elements 405 (e.g. sensor elements such as capture electrodes). The detector 240 may comprise any appropriate type of detector. For example, capture electrodes for example to detect directly electron charge, scintillators or PIN elements can be used. The detector 240 may be a direct current detector or an indirect current detector. The detector 240 may be a detector as described below in relation to FIG. 8, FIG. 9, FIG. 10.

The detector 240 may be positioned between the objective lens array 241 and the sample 208. The detector 240 is configured to be proximate the sample 208. The detector 240 may be very close to the sample 208. Alternatively, there may be a larger gap between, the detector 240 and the sample 208. The detector 240 may be positioned in the device so as to face the sample 208. Alternatively, the detector 240 may be positioned elsewhere in the electron-optical system 41 such that part of the electron-optical device that faces the sample 208 is other than, and thus is not, a detector.

The electron-optical device forms the most down-beam part of the electron-optical system 41. In some embodiments, the gap between the electron-optical device and the sample 208 is at most about 1.5 mm. For a single beam system of the type shown in FIG. 11, the gap may be at least 0.75 mm. For a multi-beam system of the type shown in FIGS. 2-5, preferably, a distance 1' (as shown in FIG. 12) between the electron-optical device and the sample 208 is less than or equal to approximately 50 μm. The distance L is determined as the distance from a surface of the sample 208 facing the electron-optical system 41 and a surface of the electron-optical device facing the sample 208. Preferably, the distance L is less than or equal to approximately 40 μm. Preferably, the distance L is less than or equal to approximately 30 μm. Preferably, the distance L is less than or equal to approximately 20 μm. Preferably, the distance L is less than or equal to 10 μm.

Figure 8:
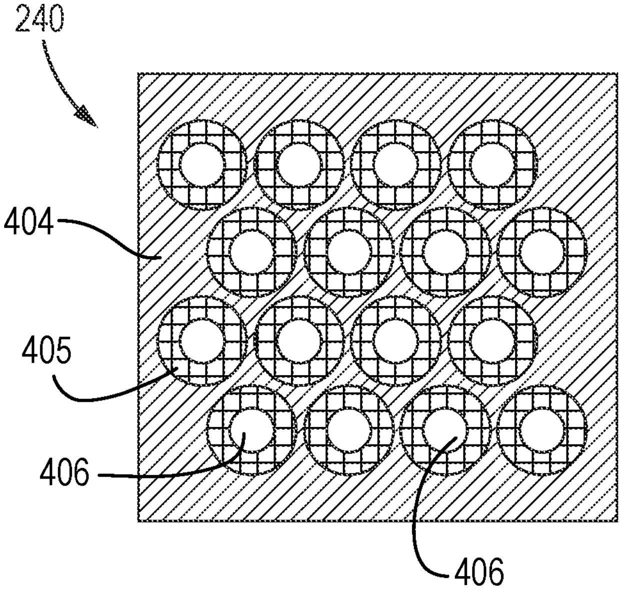
FIG. 8 is a bottom view of a modification of the objective lens array of FIG. 7.

FIG. 8 is a bottom view of the detector 240 which comprises a substrate 404 on which are provided a plurality of detector elements 405 each surrounding a beam aperture 406. The beam apertures 406 may be formed by etching through the substrate 404. In the arrangement shown in FIG. 8, the beam apertures 406 are in a hexagonal close packed array. The beam apertures 406 can also be differently arranged, e.g. in a rectangular array. The beam arrangement of the hexagonal arrangement in FIG. 8 may be more densely packed than a square beam arrangement. The detector elements 405 may be arranged in a rectangular array or a hexagonal array.

Figure 9:
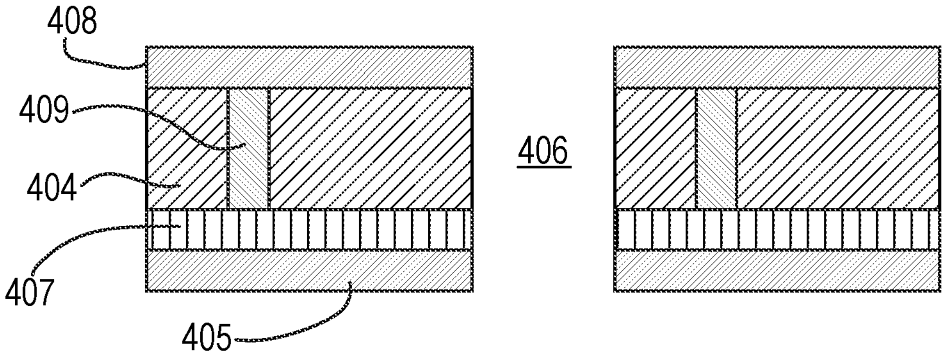
FIG. 9 is an enlarged schematic cross-sectional view of a detector incorporated in the objective lens array of FIG. 7.

FIG. 9 depicts at a larger scale a part of the detector 240 in cross section. The detector elements 405 form the bottommost, i.e. most close to the sample 208, surface of the detector 240. Between the detector elements 405 and the main body of the substrate 404 a logic layer 407 may be provided. At least part of the signal processing system may be incorporated into the logic layer 407.

A wiring layer 408 is provided on the backside of, or within, the substrate 404 and connected to the logic layer 407 by through-substrate vias 409. The number of through-substrate vias 409 need not be the same as the number of beam apertures 406. In particular if the electrode signals are digitized in the logic layer 407 only a small number of through-silicon vias may be required to provide a data bus. The wiring layer 408 can include control lines, data lines and power lines. It will be noted that in spite of the beam apertures 406 there is ample space for all necessary connections. The detection module 402 can also be fabricated using bipolar or other manufacturing techniques. A printed circuit board and/or other semiconductor chips may be provided on the backside of detector 240.

The integrated detector array described above is particularly advantageous when used with a tool having tunable landing energy as secondary electron capture can be optimized for a range of landing energies.

The detector 240 may be implemented by integrating a CMOS chip detector into a bottom electrode of the objective lens array 241. Integration of a detector 240 into the objective lens array 241 or other component of the electron-optical system 41 allows for the detection of electrons emitted in relation to multiple respective sub-beams. The CMOS chip is preferably orientated to face the sample (because of the small distance (e.g. 50 μm or less, 40 μm or less, 30 μm or less, 20 μm or less, or 10 μm) between the sample and a bottom of the charged particle-optical device and/or electron-optical system). In some embodiments, detector elements 405 to capture the secondary charged particles are formed in the surface metal layer of the CMOS device. The detector elements 405 can be formed in other layers. Power and control signals of the CMOS may be connected to the CMOS by through-silicon vias. For robustness, preferably a passive silicon substrate with holes shields the CMOS chip from high E-fields.

In order to maximize the detection efficiency it is desirable to make the surface of the detector elements 405 as large as possible, so that substantially all the area of the objective lens array 241 (excepting the apertures) is occupied by detector elements 405. Additionally or alternatively, each detector element 405 has a diameter substantially equal to the array pitch (i.e. the aperture array pitch described above in relation to the electrodes of the objective lens assembly 241). Therefore, the diameter of each detector element may be less than approximately 600 μm, and preferably between approximately 50 μm and 500 μm. As described above, the pitch may be selected depending on the intended distance L between the sample 208 and the detector 240. In some embodiments, the outer shape of the detector element 405 is a circle, but this can be made a square to maximize the detection area. Also the diameter of the through-substrate via 409 can be minimized. A typical size of the electron beam is in the order of 5 to 15 micron.

In some embodiments, a single detector element 405 surrounds each beam aperture 406. In some embodiments, a plurality of detector elements 405 are provided around each beam aperture 406. The electrons captured by the detector elements 405 surrounding one beam aperture 406 may be combined into a single signal or used to generate independent signals. The detector elements 405 may be divided radially. The detector elements 405 may form a plurality of concentric annuluses or rings. The detector elements 405 may be divided angularly. The detector elements 405 may form a plurality of sector-like pieces or segments. The segments may be of similar angular size and/or similar area. The electrode elements may be separated both radially and angularly or in any other convenient manner.

However a larger surface for the detector elements 405 leads to a larger parasitic capacitance, so a lower bandwidth. For this reason it may be desirable to limit the outer diameter of the detector elements 405. Especially in case a larger detector element 405 gives only a slightly larger detection efficiency, but a significantly larger capacitance. A circular (annular) detector element 405 may provide a good compromise between collection efficiency and parasitic capacitance.

A larger outer diameter of the detector element 405 may also lead to a larger crosstalk (sensitivity to the signal of a neighboring hole). This can also be a reason to make the outer diameter of the detector element 405 smaller. Especially in case a larger detector element 405 gives only a slightly larger detection efficiency, but a significantly larger crosstalk.

The charged particle current collected by detector element 405 is amplified, for example by an amplifier such as a TIA.

In some embodiments, the objective lens array 241 is an exchangeable module, either on its own or in combination with other elements such as the control lens array and/or detector array. The exchangeable module may be field replaceable, i.e. the module can be swapped for a new module by a field engineer. In some embodiments, multiple exchangeable modules are contained within the tool and can be swapped between operable and non-operable positions without opening the charged particle assessment system 40.

In some embodiments, the exchangeable module comprises an electron-optical component, and specifically may be the charged particle-optical device, which is on a stage permitting actuation for positioning of the component. In some embodiments, the exchangeable module comprises a stage. In an arrangement, the stage and the exchangeable module may be an integral part of the tool. In an arrangement the exchangeable module is limited to the stage and the device, such as the charged particle-optical device, it supports. In an arrangement the stage is removable. In an alternative design the exchangeable module comprising the stage is removable. The part of the charged particle assessment system 40 for the exchangeable module is isolatable, that is the part of the charged particle assessment system 40 is defined by a valve up-beam and a valve down-beam of the exchangeable module. The valves can be operated to isolate the environment between the valves from the vacuum up-beam and down-beam of the valves respectively enabling the exchangeable module to be removed from the charged particle assessment system 40 whilst maintaining the vacuum up-beam and down-beam of the part of the charged particle assessment system 40 associated with the exchangeable module. In some embodiments, the exchangeable module comprises a stage. The stage is configured to support a device, such as the charged particle-optical device, relative to the beam path. In some embodiments, the module comprises one or more actuators. The actuators are associated with the stage. The actuators are configured to move the device relative to the beam path. Such actuation may be used to align the device and the beam path with respect to each other.

In some embodiments, the exchangeable module is a microelectromechanical systems (MEMS) module. MEMS are miniaturized mechanical and electromechanical elements that are made using microfabrication techniques. In some embodiments, the exchangeable module is configured to be replaceable within the charged particle assessment system 40. In some embodiments, the exchangeable module is configured to be field replaceable. Field replaceable is intended to mean that the module may be removed and replaced with the same or different module while maintaining the vacuum in which the electron-optical tool is located. Only a section of the charged particle assessment system 40 is vented corresponding to the module is vented for the module to be removed and returned or replaced.

The control lens array 250 may be in the same module as an objective lens array 241, i.e. forming an objective lens array assembly or objective lens arrangement, or it may be in a separate module.

In some embodiments, one or more aberration correctors are provided that reduce one or more aberrations in the sub-beams. The one or more aberration correctors may be provided in any of the embodiments, e.g. as part of the charged particle-optical device, and/or as part of an optical lens array assembly, and/or as part of an assessment system. In some embodiments, each of at least a subset of the aberration correctors is positioned in, or directly adjacent to, a respective one of the intermediate foci (e.g. in or adjacent to the intermediate image plane). The sub-beams have a smallest cross-sectional area in or near a focal plane such as the intermediate plane. This provides more space for aberration correctors than is available elsewhere, i.e. upbeam or downbeam of the intermediate plane (or than would be available in alternative arrangements that do not have an intermediate image plane).

In some embodiments, aberration correctors positioned in, or directly adjacent to, the intermediate foci (or intermediate image plane) comprise deflectors to correct for the source 201 appearing to be at different positions for different beams. Correctors can be used to correct macroscopic aberrations resulting from the source that prevent a good alignment between each sub-beam and a corresponding objective lens.

The aberration correctors may correct aberrations that prevent a proper column alignment. Such aberrations may also lead to a misalignment between the sub-beams and the correctors. For this reason, it may be desirable to additionally or alternatively position aberration correctors at or near the condenser lenses 231 (e.g. with each such aberration corrector being integrated with, or directly adjacent to, one or more of the condenser lenses 231). This is desirable because at or near the condenser lenses 231 aberrations will not yet have led to a shift of corresponding sub-beams because the condenser lenses are vertically close or coincident with the beam apertures. A challenge with positioning correctors at or near the condenser lenses, however, is that the sub-beams each have relatively large sectional areas and relatively small pitch at this location, relative to locations further downstream. The aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference.

In some embodiments, each of at least a subset of the aberration correctors is integrated with, or directly adjacent to, the objective lens array 241. In some embodiments, these aberration correctors reduce one or more of the following: field curvature; focus error; and astigmatism. Additionally or alternatively, one or more scanning deflectors (not shown) may be integrated with, or directly adjacent to, the objective lens array 241 for scanning the sub-beams 211, 212, 213 over the sample 208. In some embodiments, the scanning deflectors described in US 2010/0276606, which document is hereby incorporated by reference in its entirety, may be used.

Figure 10:
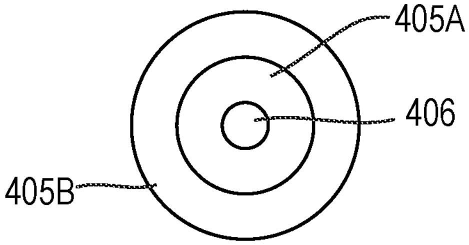
FIG. 10 is a bottom view of a detector element of a detector.

The detector may be provided with multiple portions and more specifically, multiple detecting portions. The detector comprising multiple portions may be associated with one of the sub-beams 211, 212, 213. Thus, the multiple portions of one detector 240 may be configured to detect signal particles emitted from the sample 208 in relation to one of the primary beams (which may otherwise be referred to as sub-beams 211, 212, 213). In other words, the detector comprising multiple portions may be associated with one of the apertures in at least one of the electrodes of the objective lens assembly. More specifically, the detector 405 comprising multiple portions may be arranged around a single aperture 406 as shown in FIG. 10, which provides an example of such a detector. In some embodiments, the single beam system of FIG. 11 comprises such a detector comprising multiple portions.

As shown in FIG. 10, the detector element 405, in which an aperture 406 is defined and configured for the through passage of a charged particle beam, comprises an inner detecting portion 405A and an outer detecting portion 405B. The inner detecting portion 405A surrounds the aperture 406 of the detector. The outer detecting portion 405B is radially outwards of the inner detecting portion 405A. The shape of the detector may be generally circular. Thus, the inner detecting portion and the outer detecting portion may be concentric rings.

The disclosed embodiments can be applied to various different tool architectures. For example, the charged particle assessment system 40 may be a single beam tool or may comprise a plurality of single beam columns or may comprise a plurality of columns of multi-beams. The columns may comprise the electron-optical system 41 described in any of the above embodiments or aspects. As a plurality of columns (or a multi-column tool), the devices may be arranged in an array which may number two to one hundred columns or more. The charged particle assessment system 40 may take the form of an example described with respect to and depicted in FIG. 3 or as described with respect to and depicted in FIG. 4, although preferably having an electrostatic scan deflector array and an electrostatic collimator array. A charged particle column may optionally comprise a source.

Figure 11:
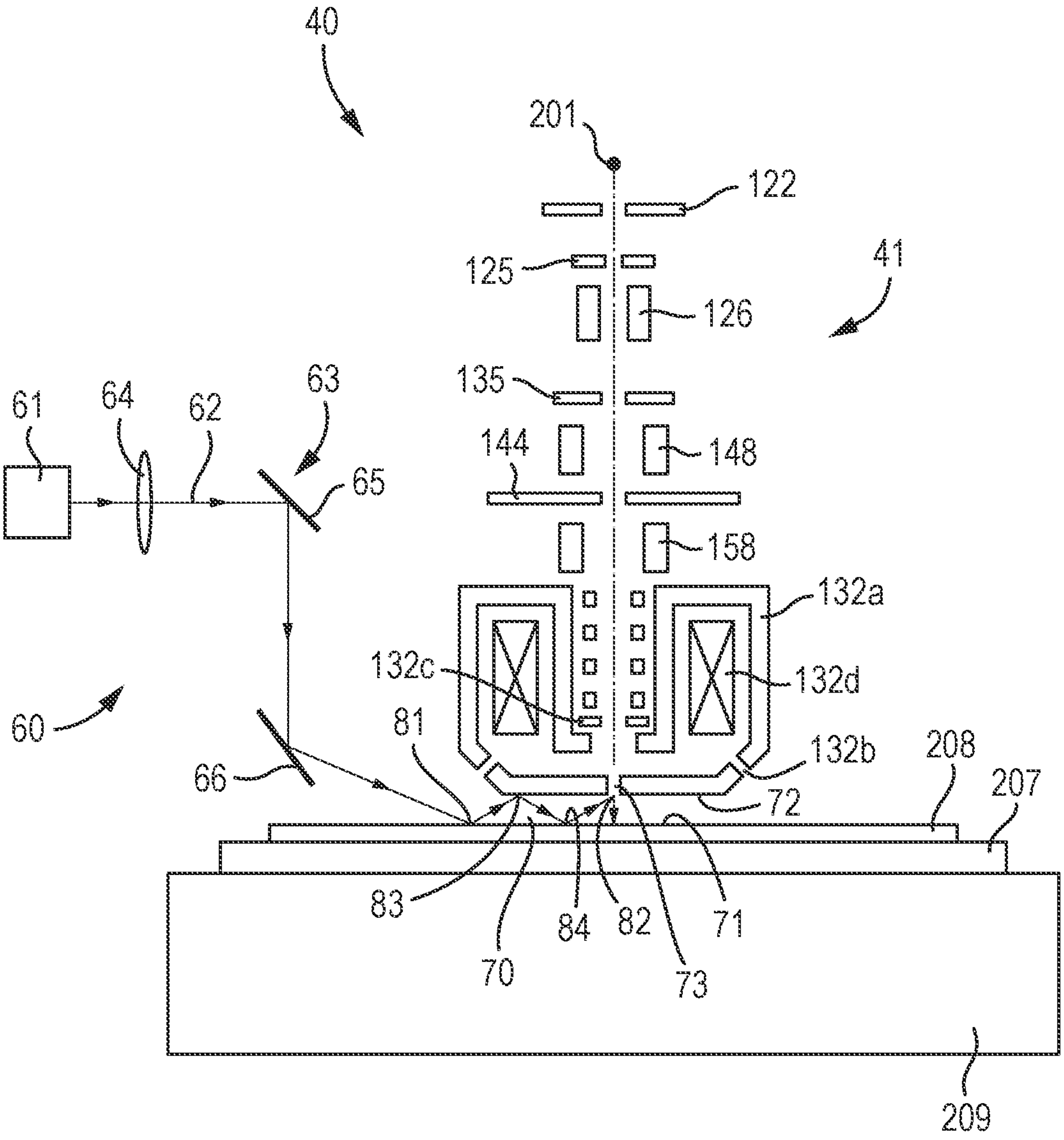
FIG. 11 is a schematic diagram of an exemplary single beam charged particle assessment system according to some embodiments of the present disclosure.
Figure 12:
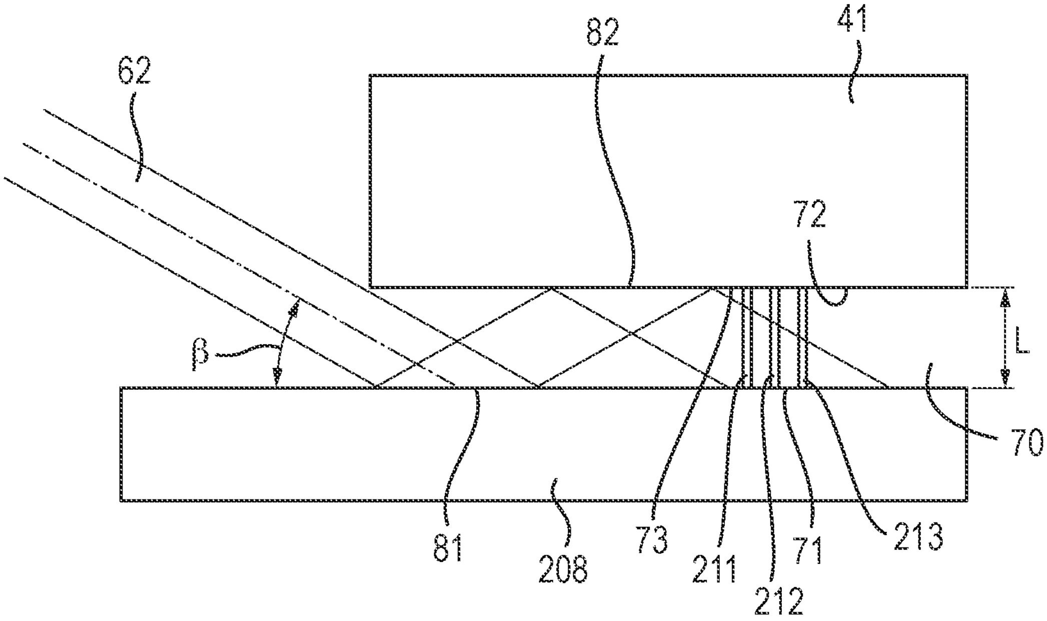
FIG. 12 is a schematic diagram of a light beam entering between the electron-optical device and the sample according to some embodiments of the present disclosure.

FIG. 11 is a schematic diagram of an exemplary single beam charged particle assessment system 40 according to some embodiments. As shown in FIG. 11, the charged particle assessment system 40 comprises a sample holder 207 supported by a motorized stage 209 to hold a sample 208 to be inspected. The charged particle assessment system 40 comprises an electron source 201. The charged particle assessment system 40 further comprises a gun aperture 122, a beam limit aperture 125, a condenser lens 126, a column aperture 135, an objective lens assembly 132, and an electron detector 144. The objective lens assembly 132, in some embodiments, may be a modified swing objective retarding immersion lens (SORIL), which includes a pole piece 132*a*, a control electrode 132*b*, a deflector 132*c*, and an exciting coil 132*d*. The control electrode 132*b* has an aperture formed in it for the passage of the electron beam. The control electrode 132*b* forms the facing surface 72, described in more detail below. Although the charged particle assessment system 40 shown in FIG. 11 is a single beam system, in some embodiments, a multi-beam system is provided. Such a multi-beam system may have the same features as shown in FIG. 11, such as the objective lens assembly 132. Such a multi-beam system may have a secondary column for detecting signal electrons.

In an imaging process, an electron beam emanating from the source 201 may pass through the gun aperture 122, the beam limit aperture 125, the condenser lens 126, and be focused into a probe spot by the modified SORIL lens and then impinge onto the surface of sample 208. The probe spot may be scanned across the surface of the sample 208 by the deflector 132*c* or other deflectors in the SORIL lens. Signal electrons emanated from the sample surface may be collected by the electron detector 144 to form an image of an area of interest on the sample 208.

The condenser and illumination optics of the electron-optical system 41 may comprise or be supplemented by electromagnetic quadrupole electron lenses. For example, as shown in FIG. 11 the electron-optical system 41 may comprise a first quadrupole lens 148 and a second quadrupole lens 158. In some embodiments, the quadrupole lenses are used for controlling the electron beam. For example, first quadrupole lens 148 can be controlled to adjust the beam current and second quadrupole lens 158 can be controlled to adjust the beam spot size and beam shape.

As mentioned above, the projection assembly 60 functions as an ACC module to illuminate a light beam 62, such as a laser beam, on the sample 208. By illuminating the sample 208 with a light beam 62 while performing the electron beam defect inspection the defect contrast is significantly improved.

It can be difficult to illuminate the relevant part of the sample 208 with the light beam 62. For example, the dimensions of the electron-optical device 41 and the sample 208 may make it difficult to reach the relevant part of the sample 208 with the light beam 62. For example, there may be only a very narrow gap 70 between the electron-optical device 41 and the sample 208. In some embodiments, the distance 'L' as shown in FIG. 12, between electron-optical device 41 and the sample 208 is less than or equal to approximately 1.5 mm, and optionally less than or equal to approximately 50 μm.

FIG. 12 is a schematic diagram of a light beam 62 entering between the electron-optical device 41 and the sample 208 according to some embodiments. In some embodiments, the charged particle assessment system 40 comprises a sample holder 207 configured to hold a sample 208. The sample 208 has a surface facing the electron-optical device 41. The electron-optical device 41 is configured to project an electron beam 211, 212, 213 towards the sample 208. The electron beam 211, 212, 213 has a field of view corresponding to a portion 71 of the surface of the sample 208. The electron-optical device 41 has a facing surface 72 facing the sample holder 207. The facing surface 72 faces the sample 208 or the sample holder 207 or at least a sample position e.g. on the sample holder for the sample 208. The facing surface 72 is at the most down-beam part of the electron-optical device 41. The most down beam surface of the electron-optical device 41 may be the facing surface 72. Desirably the facing surface 72 is static with respect to the electron-optical device 41. The facing surface may be proximate the sample position i.e. the sample holder, e.g. the sample 208. The facing surface may be the surface of the electron-optical device 41 that is most proximate the sample position, i.e. the sample holder and so, when present, the sample 208.

The charged particle assessment system 40 comprises the projection assembly 60. In some embodiments, the projection assembly 60 is arranged to direct a light beam 62 along a light path such that the light beam 62 reflects off the facing surface 72 up-beam, with respect to the light path, of being incident on the portion 71 of the surface of the sample 208.

At least some of the embodiments of the present disclosure are expected to achieve coupling of the light beam 62 through the gap 70 even when the gap 70 is particularly narrow such as less than or equal to approximately 50 μm. At least some of the embodiments of the present disclosure are expected to achieve illumination of the portion 71 of the surface of the substrate 208 without requiring the illumination to be directly incident on the portion 71. At least some of the embodiments of the present disclosure are expected to increase design freedom of how the projection assembly 60 is arranged relative to the electron-optical device 41 and the sample 208.

As shown in FIG. 12, in some embodiments, the light beam 62 at least covers the portion 71 of the surface of the sample 208 corresponding to the field of view of the electron beam 211, 212, 213. At least some of the embodiments of the present disclosure are expected to achieve improved defect contrast for the electron beam 211, 212, 213. This is possible for a single beam and for a multi-beam.

Figure 13:
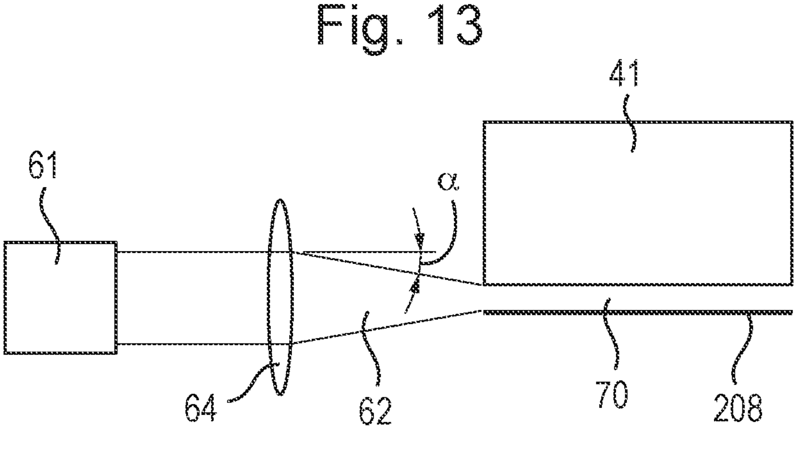
FIG. 13 is a diagram explaining the focus angle of a light beam entering between the electron-optical device and the sample according to some embodiments of the present disclosure.

FIG. 13 is a diagram explaining the focus angle $\alpha$ of a light beam 62 entering between the electron-optical device 41 and the sample 208 according to some embodiments. As shown in FIG. 13, the projection system 60 comprises a light source 61. The light source 61 is configured to emit the light beam 62. In some embodiments, the light source 61 is a laser light source. Laser light provides a coherent light beam 62. However, other types of light source can alternatively be used. In some embodiments, the light source 61 is configured to emit a light beam 62 having a wavelength in the range of from 450 nm to 850 nm.

As shown in FIGS. 2-5 and FIG. 11, in some embodiments, the projection assembly 60 comprises an optical system 63. In some embodiments, the optical system 63 is configured to focus the light beam 62 to be narrower in a direction perpendicular to the facing surface 72 than in a direction parallel to the facing surface 72 and perpendicular to an axis of the light beam 62. (Note the facing surface may be substantially planar. The facing surface may be parallel with a surface of the sample that the facing surface faces. The facing surface may be co-planar with the surface of the sample, i.e. the surface of the sample 208 that the facing surface faces). The direction perpendicular to the facing surface 72 is perpendicular to the sample 208, i.e. the up-and-down direction in the view of FIG. 13. The direction parallel to the facing surface 72 and perpendicular to the axis of the light beam 62 is the direction into and out of the diagram in the view of FIG. 13. The axis of the light beam 62 is the primary direction in which the light beam 62 projects and is shown as a dot-chain line in FIG. 12.

In one direction, the light beam 62 can be relatively broad. For example, in some embodiments, the light beam has a breadth of at least 1 mm, optionally at least 2 mm, optionally at least 5 mm, optionally at least 10 mm and optionally at least 20 mm in one direction. In the other direction, the light beam 62 is focused into the gap 70. The light beam 62 may have a breadth in this other direction of at most 500 μm, optionally at most 200 μm, optionally at most 100 μm and optionally at most 50 μm. The breadth of the light beam 62 varies along its length because it is focused. The breadth measurements mentioned above are of the light beam 62 at the position along its axis where it enters the gap 70.

By focusing the light beam 62 into the gap 70, a greater intensity of light of the light beam 62 can reach the sample 208. This can help to improve the contrast when detecting defects on the sample 208.

In some embodiments, the light beam 62 is not focused more in one direction than another. Such an arrangement simplifies the projection system 60. However, particularly for a narrow gap 70 some of the light beam 62 may not reach into the gap 70. Some of the light beam 62 may be prevented from entering into the gap 70. As a result a greater portion fails to reach the intended portion 71 of the sample surface.

As shown in FIG. 13, in some embodiments, the optical system 63 comprises a cylindrical lens 64. The cylindrical lens 64 is configured to focus the light beam 62 more in one direction than in an orthogonal direction. The cylindrical lens increases the design freedom for the light source 61. In some embodiments, the light source 61 is configured to emit a light beam 62 having a circular cross section. The cylindrical lens 64 is configured to focus the light beam 62 such that the light beam has an elliptical cross section.

It is not essential for a cylindrical lens 64 to be provided. In some embodiments, another optical component can be used that is capable of focusing more strongly in one direction than another. In some embodiments, the light source is configured to emit a light beam 62 that is elliptical or rectangular, for example.

As shown in FIG. 13, in some embodiments, the optical system 63 is configured to focus the light beam 62 such that the light beam 62 fits the gap 70 for example within an entrance to the gap. The light beam 62 has approximately the same dimension as the gap 70 in the direction perpendicular to the sample 208 where the light beam 62 enters the gap 70. Substantially all of the light beam 62 enters the gap 70. This focusing of the light beam 62 reduces the proportion of the light beam 62 that is wasted, for example that does not enter the gap 70. In some embodiments, the cross-section of the light beam is larger than the entrance to the gap, for example in a direction orthogonal to the facing surface. In this arrangement some of the light beam does not fit into the gap 70.

In some embodiments, the projection assembly 60 is arranged relative to the gap 70 such that where the light beam 62 enters the gap 70, the light beam 62 extends along most of the gap 70 in a direction perpendicular to the facing surface 72. The gap 70 is relatively narrow such that the light beam 62 fills most, and preferably all, of the height of the gap 70. For example, in some embodiments, the gap 70 is about 50 μm and the light beam 62 extends over more than 25 μm, and preferably all 50 μm, of the gap 70. In some embodiments, the gap 70 is about 20 μm and the light beam 62 extends over more than 10 μm, and preferably all 20 μm, of the gap 70. However, in some embodiments, the gap 70 is much higher. For example, in some embodiments, the gap 70 is at least 0.75 mm, optionally at least 1 mm and optionally about 1.5 mm. The light beam 62 may not extend across most of the gap 70. For example, in some embodiments, the light beam extends at most 200 μm, optionally at most 100 μm, and optionally at most 50 μm along the gap 70 in a direction perpendicular to the facing surface 72.

In some embodiments, the projection assembly 60 is configured such that an axis angle β (see FIG. 12) of the light beam 62 is greater than the focus angle α of the light beam 62. As shown in FIG. 12, the axis angle β is defined between a surface of the sample holder 207 (or the sample 208) facing the electron-optical system 41 and the axis of the light beam 62 immediately up-beam of its entry between the electron-optical system and the sample holder 207 (or the sample 208). The axis angle β may be referred to as the grazing angle of the path of the light beam relative to the sample holder 207. (The angle of incidence of the path of the light beam is defined relative to the normal of the sample surface). Further up-beam of the entry point, the light beam 62 may, for example, be folded as shown in FIGS. 2-5 and FIG. 11. However, immediately up-beam of the entry point the light beam 62 is not folded such that the axis of the light beam is a straight line. The axis angle β is the angle of the axis of the light beam 62 with respect to the surface of the sample 208.

As shown in FIG. 13, the focus angle α is defined as a taper angle of the light beam 62 caused by the optical system 63 focusing the light beam 62. The focus angle α relates to the focusing of the light beam 62 in the plane in which the light beam 62 is maximally focused, i.e. the plane of the diagram in the view of FIG. 13. The focus angle α may alternatively be referred to as the internal opening angle of the light beam 62. The focus angle α is related to how narrowly the light beam 62 focused into the gap 70. A greater value of the focus angle α is related to less diffraction of the light beam 62. This affects the size of the spot formed by the light beam 62. The size of a diffraction limited spot is proportional to the wavelength of the light of the light beam. The size of a diffraction limited spot is inversely proportional to the focus angle α.

Figure 14:
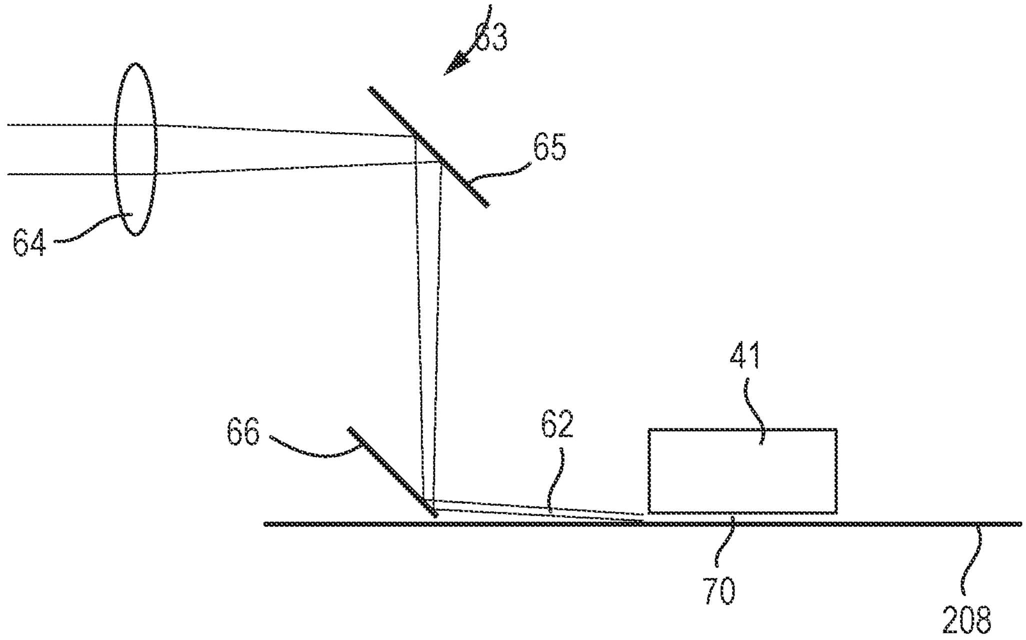
FIG. 14 is a schematic diagram of a projection assembly projecting a light beam entering between the electron-optical device and the sample according to some embodiments of the present disclosure.

FIG. 14 is a schematic diagram of a projection assembly 60 projecting a light beam 62 entering between the electron-optical device 41 and the sample 208 according to some embodiments. By providing that the axis angle β is greater than the focus angle α, the light beam 62 can have a downward (i.e. towards the sample 208) trajectory immediately up-beam of where the light beam enters the gap 70. The light beam 62 enters the gap 70 from the side of the gap 70. This increase the design freedom of where the projection assembly 60 can be positioned relative to the sample 208. For example, the last component of the optical system 63 of the projection assembly 60 can be positioned above the sample 208 as shown in FIG. 14.

As shown in FIG. 14, in some embodiments, the optical system 63 comprises reflecting surfaces 65, 66 such as mirrors. For example two reflecting surfaces 65, 66 may be provided. In some embodiments, the optical system 63 does not reflect the light beam 62. The light beam 62 may be directed straight to the gap 70. In some embodiments, the optical system 63 may comprise one, three or more than three reflecting surfaces. The number and arrangement of the reflecting surfaces may be chosen depending on the dimensions of the volume in which the projection system 60 is required to fit.

However, it is not essential for the axis angle β to be greater than the focus angle α. In some embodiments, the last component of the optical system 63 of the projection assembly 60 is positioned below the level of the upper surface of the sample 208. In some embodiments, the projection assembly 60 is arranged such that the light beam is first incident on the facing surface 72 rather than on the sample 208.

Figure 15:
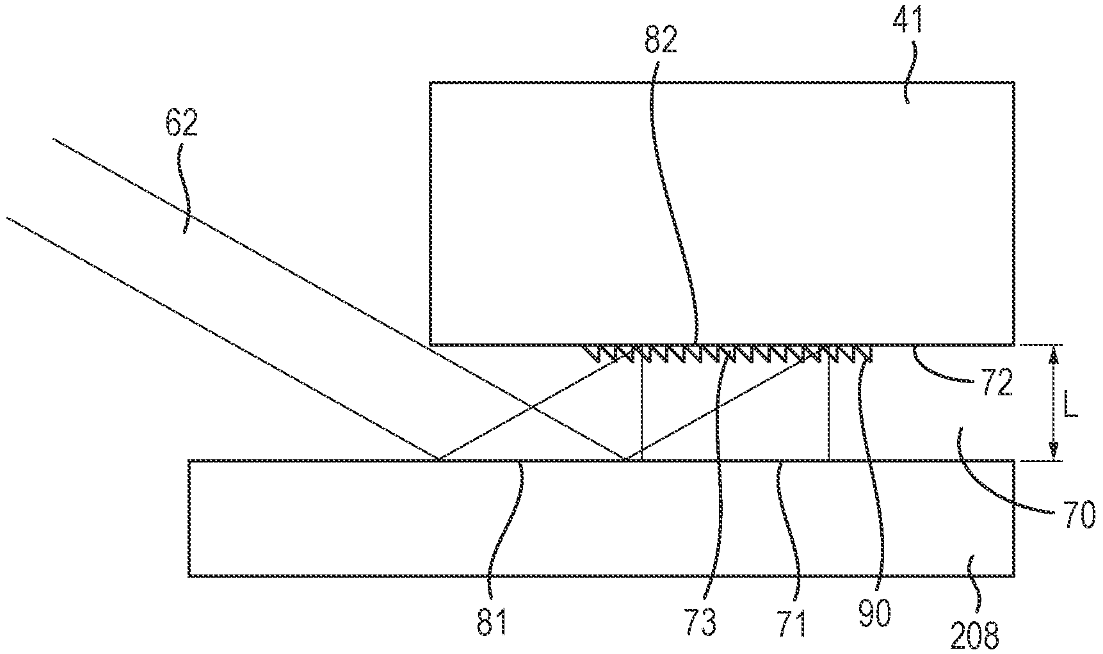
FIG. 15 is a schematic diagram of a light beam entering between the electron-optical device and the sample according to some embodiments of the present disclosure.

FIG. 15 is a schematic diagram of a light beam 62 entering between the electron-optical device 41 and the sample 208 according to some embodiments. As shown in FIG. 15, the facing surface 72 comprises a surface topography 90, for example as a topographical region, so as to reflect the light beam 62 towards the sample 208. The facing surface 72 is generally planar. In some embodiments, the facing surface 72 away from the topographical region has a surface angle of at most 20°, optionally at most 10°, optionally at most 5°, optionally at most 2° and optionally at most 1° for at least 50%, optionally at least 80% and optionally at least 90% of the facing surface 72. The surface topography 90 is intentionally angled relative to the plane of the facing surface, i.e. non-planar, so as to control the direction in which the light beam 62 reflects.

By providing the surface topography 90, it is possible to control the angle of incidence of the light beam 62 on the portion 71 of the surface of the sample 208. This can be seen from a comparison between FIG. 12 and FIG. 15. In the charged particle assessment system 40 of FIG. 12, no surface topography 90 is provided. As a result, the angle of incidence of the light beam 62 on the portion 71 is similar to the angle at which the light beam 62 enters the gap 70. This may be a very large angle, particularly when the gap 70 is narrow. That is the grazing angle of the path of the light beam 62 relative to the sample holder 207 (or sample 208) is very shallow, for example so shallow that a small proportion at best of the light of the light beam is absorbed on incidence of the light beam on the sample 208 and/or facing surface 72. In contrast, in the charged particle assessment system 40 of FIG. 15, the surface topography 90 is provided. As a result, the angle of incidence of the light beam 62 on the portion 71 can be different from the angle at which the light beam 62 enters the gap 70. For example, as shown in FIG. 15, the angle of incidence of the light beam 62 on the portion 71 can be smaller than the angle at which the light beam 62 enters the gap 70. That is the grazing angle, (3, can be greater than the angle at which the light beam 62 enters the gap 70. As a result, the angle of incidence of the light beam 62 on the portion 71 can be controlled to be suitably high even when the angle at which the light beam 62 enters the gap 70 relative to surface of the sample 208 is required to be shallow.

By setting the angle of incidence towards the portion 71, the absorption of the light beam 62 into the portion 71 of the sample 208 can be increased. At least some of the embodiments of the present disclosure are expected to increase the proportion of the light beam 62 that is used to improve the contrast in the detection of defects in the portion 71.

As shown in FIG. 15, in some embodiments, the surface topography 90 is arranged such that the angle of the light beam 62 on the sample 208 is approximately a right angle, i.e. the light beam 62 is approximately perpendicular to the sample 208. The light beam 62 may be approximately parallel to the electron beam 211, 212, 213. In some embodiments, the surface topography 90 is arranged such that the grazing angle of the light beam 62 on the sample 208 is oblique.

In some embodiments, the surface topography 90 comprises surfaces that are at least 30° relative to the surface of the sample 208. In some embodiments, surface topography 90 comprises surfaces that are is at most 60° relative to the surface of the sample 208. In some embodiments, surface topography 90 comprises surfaces that are is approximately 45° relative to the surface of the sample 208. In some embodiments, the surfaces cover at least 90% of the contiguous topographical region.

As shown in FIG. 15, in some embodiments, the surface topography 90 comprises sawtooth shaped elements angled to reflect the light beam 62 to the portion 71 of the surface of the sample 208. In some embodiments, the sawtooth shaped elements comprise the surfaces are angled relative to the surface of the sample 208 and may be triangular in profile. The saw tooth shaped elements may be regular of similar shape, size or both. In arrangement the surface topography 90 may comprises sawtooth shaped elements of different size and or different angle. The surface topography 90 may comprise alternative shapes such as dimples which may be hemispherical or irregular shapes. The surface topography 90 may have a corrugated surface with preferably each corrugation having a similar shaped profile which may curved, or may be triangular such as a sawtooth shaped element. The corrugation and/or sawtooth shaped elements may be aligned in a different direction, such as orthogonal, to a component of the path of the light beam into the gap and that is coplanar to the facing surface.

In some embodiments, the surface topography 90 comprises shapes that have a smaller dimension than the wavelength of the light beam 62, i.e. sub-wavelength features. In some embodiments, the surface topography 90 comprises microstructures. In some embodiments, the microstructures are formed of aluminum or silver. The microstructures may be fabricated by lithography and etching techniques.

However, it is not essential for the surface topography 90 to be provided. In some embodiments, the facing surface is planar, as shown in FIG. 12, for example the topography of the facing surface is planar.

As shown in FIG. 15, in some embodiments, the projection assembly 60 is positioned relative to the electron-optical device 41 and the sample holder 207 so that the projection assembly 60 directs the light beam 62 such that its most down-beam, with respect to the light path, reflection 82 off the facing surface 72 up-beam of being incident on the portion 71 of the surface of the sample is at a topographical region 73 facing the portion 71. The topographical region 73 is part of the facing portion that faces the portion 71. Lines that are perpendicular to the portion pass through the topographical region 73. In some embodiments, the projection assembly 60 is arranged to direct the light beam 62 such that the light beam 62 reflects off the topographical region 73.

In some embodiments, the facing surface 72 comprises a topographical region facing the portion 71. The topographical region may be directly above the portion 71. The topographical region has a surface topography 90 so as to reflect an obliquely incident light beam 62 towards the portion 71. As a result, the angle of incidence of the light beam 62 on the portion 71 is small, and may be substantially zero.

By providing that the last reflection 82 (before incidence on the portion 71) is where the facing surface 72 faces the portion 71, the angle of incidence on the portion is relatively low (i.e. the grazing angle is relatively high). At least some of the embodiments of the present disclosure are expected to reduce the proportion of the light beam 62 that reflects off the portion 71 and does not contribute to improving the detection of defects. By providing that a topographical region 73 is where the facing surface 72 faces the portion 71, the surface topography 90 helps to direct the light beam 62 onto the portion 71.

As shown in FIG. 15, in some embodiments, the surface topography 90 is provided where the facing surface 72 faces the portion 71. In some embodiments, the surface topography 90 may be provided away from where the facing surface 72 faces the portion 71. This may increase the design freedom of the how the light beam 62 enters the gap 70. However, the further that the surface topography 90 is from the portion 71, the shallower the grazing angle of the light beam path towards the portion 71; thus the lower proportion of the light beam is absorbed on incidence with portion. This may increase the proportion of the light beam 62 that reflects off the portion 71.

In some embodiments, within the topographical region 73 facing the portion 71 is defined an aperture in the facing surface 72 for passage of the electron beam 211, 212, 213 towards the sample 208. The topographical region 73 is related to where the electron beam 211, 212, 213 passes through the facing surface 72 The surface of the facing surface 72 around the aperture may correspond to the topographical region 73.

In some embodiments, the facing surface 72 comprises a scattering region, the surface topography 90 of the scattering region being configured to scatter the light beam 62 when reflecting the light beam 62 towards the sample 208. In some embodiments, the surface topography is configured to scatter the light beam 62 in addition to reflecting the light beam 62. The surface topography 90 therefore forms a scattering region. For example, in some embodiments, the surface topography 90 comprises a rough and/or a textured surface. The rough and/or textured surface may comprise surface topographies that reflect the light beam 62 in different directions, thereby scattering the light beam 62.

In some embodiments, the projection system 60 and the scattering region are configured such that the surface topography 90 of the scattering region has a roughness value greater than a wavelength of the light beam 62.

In some embodiments, the projection assembly 60 is positioned relative to the electron-optical device 41 and the sample holder 207 so that the projection assembly 60 directs the light beam 62 to reflect off the scattering region. As shown in FIG. 15, in some embodiments, the scattering region faces the portion 71 of the surface of the sample 208. This allows scattering of the light beam 62 without causing the grazing angle of the light beam 62 on the portion 71 to become too shallow. In some embodiments, the projection assembly 60 is arranged to direct the light beam 62 such that the light beam 62 reflects off the scattering region.

As shown in FIG. 12 and FIG. 15, in some embodiments, the projection assembly 60 is arranged to direct the light beam 62 such that the light beam 62 reflects off the surface of the sample 208 up-beam, with respect to the light path, of reflecting off the facing surface 72. For example, the initial reflection 81 of the light beam 62 may be on the sample 208. This allows the light beam 62 to have a generally downward trajectory when entering the gap 70. This can increase design freedom for the positioning of the projection assembly. In some embodiments, the light beam 62 is directed to reach its last reflection 82, for example off the facing surface 72, directly. In some embodiments, the projection assembly 60 is arranged to direct the light beam 62 directly onto the sample 208 such that the light of the light beam 62 reflects off the surface of the sample 208 before reflecting off the facing surface 72. In some embodiments, the projection assembly 60 is arranged to direct the light beam 62 directly onto the sample holder 207 such that the light of the light beam 62 reflects off the surface of the sample holder 207 before reflecting off the facing surface 72.

In some embodiments, the projection assembly 60 is arranged to direct the light beam 62 such that the light beam 62 reflects at least twice (not shown) off the facing surface 72 up-beam, with respect to the light path, of being incident on the portion 71 of the surface of the sample 208. By providing a greater number of reflections, the light beam 62 can reach the portion 71 even when the gap 70 is long in the horizontal direction and very narrow in the vertical direction as shown in the drawings. In such an arrangement the portion 71 may be, relative to the dimension of the gap between the sample and facing surface, far into the gap. Such a gap may have a relatively small aspect ratio, for example of its height (between the sample and facing surface) compared to its width (cross-section size orthogonal to the beam path). In some embodiments, a dimension of the gap 70 in a direction across a path of the electron beam 211, 212, 213 is at least 10, preferably at least 100, or more preferably at least 1000 times a dimension of the gap in a direction parallel to the path of the charged particle beam 211, 212, 213. The light path can be selected depending on the dimensions of the electron-optical device 41.

As explained above, in some embodiments, the charged particle assessment system 40 comprises a detector 240 configured to detect signal particles emitted by the sample 208. As shown in FIG. 3, in some embodiments, the detector 240 forms the most down-beam, with respect to the electron beam 211, 212, 213, surface of the electron-optical device 41. In some embodiments, the facing surface 72 is comprised at least in part by the detector 240. In another arrangement, the facing surface 72 is an electrode of an objective lens assembly 132 for example of an electro-magnetic objective lens or an electro-static objective lens. The detector 240 may be associated and even comprise part of the objective lens arrangement. In another arrangement the detector is located in a secondary column adjoining or connected to the charged particle column comprising the electron-optical device 41.

In some embodiments, the facing surface 72 comprises an electrically conducting material. For example the material may be a metal such as aluminum, silver or copper. In some embodiments, the angle of incidence of the light beam 62 on the facing surface 72 at the last reflection 82 is at most 20°, optionally at most 10°, optionally at most 5°, optionally at most 2° and optionally at most 1°. When the angle of incidence is higher, the proportion of the light beam 62 that is reflected to the portion 71 is lower. In some embodiments, the facing surface 72 comprises a more highly reflective material (with respect to the light beam 62) layered on a less reflective material. For example, aluminum or silver may be layered on copper. Use of a such a layer of reflective material on a copper surface enables a broader range of light sources of the light beam over a larger range of wavelengths with a lower risk of absorption of the light. The more highly reflective material forms the facing surface 72 such that a higher proportion of the light beam is reflected to the portion 71. This is particularly beneficial when the angle of incidence of the light beam 62 on the facing surface 72 is higher. Higher angles of incidence are possible particularly when the gap 70 is relatively large.

In some embodiments, the detector 240 comprises a detector element 405 configured to receive an electrical current derived from a signal particle from the sample 208. In some embodiments, the detector element 405 provides a surface element of the facing surface 72. In some embodiments, the surface topography 82 of the surface element is arranged so as to reflect the light beam 62 towards the sample 208. For example, microstructures such as sawtooth shaped elements and/or roughened or structured surface may be formed on the detector element 405.

In some embodiments, the electron-optical system 41 comprises an objective lens assembly configured to focus the electron beam 211, 212, 213 on the sample 208. The facing surface 72 may be a surface of the objective lens assembly. For example, the objective lens assembly may comprise the detector 240 forming the facing surface 72. Alternatively, the detector 240 may be provided elsewhere in the objective lens assembly or may be provided separately from the objective lens assembly.

In some embodiments, a method of operating a charged particle assessment system 40 is provided. For example, the method comprises holding a sample 208 in a sample holder 207. The method comprises projecting an electron beam 211, 212, 213 towards the sample 208 using an electron-optical device 41. The electron beam 211, 212, 213 has a field of view corresponding to a portion 71 of a surface of the sample 208. The electron-optical device 41 has a facing surface 72 facing the sample 208. The field of view on the surface of the sample may have dimension in the range of 100 to 40000 micron, desirably 1 to 30 mm, desirably at least 5 mm. The field of view may have at least two dimensions in different directions (desirably orthogonal) of such a dimensional range.

In some embodiments, the method comprises directing a light beam 62 along a light path using a projection assembly 60 such that the light beam 62 reflects off the facing surface 72 up-beam, with respect to the light path, of being incident on the portion 71.

In some embodiments, the directing comprises controlling the light beam 62 by controlling the projection assembly 60. In some embodiments, the controller 50 is configured to control the projection assembly 60. In some embodiments, the light beam 62 illuminates the portion 71 continuously during an inspection process.

Reference to a component or system of components or elements being controllable to manipulate a charged particle beam in a certain manner includes configuring a controller or control system or control unit to control the component to manipulate the charged particle beam in the manner described, as well optionally using other controllers or devices (e.g. voltage supplies and or current supplies) to control the component to manipulate the charged particle beam in this manner. For example, a voltage supply may be electrically connected to one or more components to apply potentials to the components, such as in a non-limited list the control lens array 250, the objective lens array 241, the condenser lens 231, correctors, a collimator element array and scan deflector array 260, under the control of the controller or control system or control unit. An actuatable component, such as a stage, may be controllable to actuate and thus move relative to another components such as the beam path using one or more controllers, control systems, or control units to control the actuation of the component.

The embodiments herein described may take the form of a series of aperture arrays or electron-optical elements arranged in arrays along a beam or a multi-beam path. Such electron-optical elements may be electrostatic. In some embodiments, all the electron-optical elements, for example from a beam limiting aperture array to a last electron-optical element in a sub-beam path before a sample, may be electrostatic and/or may be in the form of an aperture array or a plate array. In some arrangements one or more of the electron-optical elements are manufactured as a microelectromechanical system (MEMS) (i.e. using MEMS manufacturing techniques).

References to upper and lower, up and down, above and below should be understood as referring to directions parallel to the (typically but not always vertical) up-beam and down-beam directions of the electron beam or multi-beam impinging on the sample 208. Thus, references to up beam and down beam are intended to refer to directions in respect of the beam path independently of any present gravitational field.

An assessment system according to some embodiments of the disclosure may be a tool that makes a qualitative assessment of a sample (e.g. pass/fail), one which makes a quantitative measurement (e.g. the size of a feature) of a sample or one which generates an image of map of a sample. Examples of assessment systems are inspection tools (e.g. for identifying defects), review tools (e.g. for classifying defects) and metrology tools, or tools capable of performing any combination of assessment functionalities associated with inspection tools, review tools, or metrology tools (e.g. metro-inspection tools). The electron-optical column may be a component of an assessment system 40; such as an inspection tool or a metro-inspection tool, or part of an e-beam lithography tool. Any reference to a tool herein is intended to encompass a device, apparatus or system, the tool comprising various components which may or may not be collocated, and which may even be located in separate rooms, especially for example for data processing elements.

The terms "sub-beam" and "beamlet" are used interchangeably herein and are both understood to encompass any radiation beam derived from a parent radiation beam by dividing or splitting the parent radiation beam. The term "manipulator" is used to encompass any element which affects the path of a sub-beam or beamlet, such as a lens or deflector.

References to elements being aligned along a beam path or sub-beam path are understood to mean that the respective elements are positioned along the beam path or sub-beam path.

There is provided the following clauses:

Clause 1: A charged particle assessment system comprising: a sample holder configured to hold a sample having a surface; a charged particle-optical device configured to project a charged particle beam towards the sample, the charged particle beam having a field of view corresponding to a portion of the surface of the sample, the charged particle-optical device having a facing surface facing the sample holder; and a projection assembly arranged to direct a light beam along a light path such that the light beam reflects off the facing surface up-beam, with respect to the light path, of being incident on the portion of the surface of the sample. Desirably the facing surface is planar, such as configured to be parallel with a surface of a sample for example coplanar with the surface of the sample. Desirably the facing surface is a surface of the electron-optical device most proximate to a sample position for example a sample holder for the sample. Desirably the facing surface is the most down beam surface of the electron-optical device.

Clause 2: The charged particle assessment system of clause 1, wherein the light beam when incident on the portion of the surface of the sample at least covers the portion of the surface of the sample corresponding to the field of view of the charged particle beam.

Clause 3: The charged particle assessment system of any preceding clause, wherein the projection assembly comprises: a light source configured to emit the light beam.

Clause 4: The charged particle assessment system of any preceding clause, wherein the projection assembly comprises an optical system configured to focus the light beam to be narrower in a direction perpendicular to the facing surface than in a direction parallel to the facing surface and perpendicular to an axis of the light beam.

Clause 5: The charged particle assessment system of clause 4, wherein the optical system comprises a cylindrical lens.

Clause 6: The charged particle assessment system of clause 4 or 5, wherein the projection assembly is configured such that an axis angle of the light beam is greater than a focus angle of the light beam, wherein the axis angle is defined between a surface of the sample holder facing the charged particle-optical system and the axis of the light beam immediately up-beam of its entry between the charged particle-optical system and the sample holder, and the focus angle is defined as a taper angle of the light beam caused by the optical system focusing the light beam.

Clause 7: The charged particle assessment system of any preceding clause, wherein the facing surface comprises a surface topography so as to reflect the light beam towards the sample.

Clause 8: The charged particle assessment system of clause 7, wherein the surface topography comprises sawtooth shaped elements angled to reflect the light beam to the portion of the surface of the sample.

Clause 9: The charged particle assessment system of clause 7 or 8, wherein the projection assembly is positioned relative to the charged particle-optical device and the sample holder so that the projection assembly directs the light beam such that its most down-beam, with respect to the light path, reflection off the facing surface up-beam of being incident on the portion of the surface of the sample is at a topographical region facing the portion.

Clause 10: The charged particle assessment system of any clause 9, wherein within the topographical region facing the portion is defined an aperture in the facing surface for passage of the charged particle beam towards the sample.

Clause 11: The charged particle assessment system of any of clauses 7 to 10, wherein the facing surface comprises a scattering region, the surface topography of the scattering region being configured to scatter the light beam when reflecting the light beam towards the sample.

Clause 12: The charged particle assessment system of clause 11, wherein the projection assembly is positioned relative to the charged particle-optical device and the sample holder so that the projection assembly directs the light beam to reflect off the scattering region.

Clause 13: The charged particle assessment system of clause 11 or 12, wherein the scattering region faces at least the portion of the surface of the sample.

Clause 14: The charged particle assessment system of any of clauses 11 to 13, wherein the projection system and the scattering region are configured such that the surface topography of the scattering region has a roughness value greater than a wavelength of the light beam.

Clause 15: The charged particle assessment system of any preceding clause, wherein the projection assembly is arranged to direct the light beam such that the light beam reflects off the surface of the sample up-beam, with respect to the light path, of reflecting off the facing surface.

Clause 16: The charged particle assessment system of any preceding clause, wherein the projection assembly is arranged to direct the light beam such that the light beam reflects at least twice off the facing surface up-beam, with respect to the light path, of being incident on the portion of the surface of the sample.

Clause 17: The charged particle assessment system of any preceding clause, wherein the projection assembly is arranged to direct the light of the light beam directly onto the facing surface.

Clause 18: The charged particle assessment system of any preceding clause, comprising a detector configured to detect signal particles emitted by the sample.

Clause 19: The charged particle assessment system of clause 18, wherein the surface facing the sample holder is comprised at least in part by the detector.

Clause 20: The charged particle assessment system of clause 18 or 19, wherein the detector comprises a detector element configured to receive an electrical current derived from a signal particle from the sample.

Clause 21: The charged particle assessment system of clause 20, wherein the detector element provides a surface element of the facing surface and the surface topography of the surface element is arranged so as to reflect the light beam towards the sample.

Clause 22: The charged particle assessment system of any preceding clause, wherein a gap is defined between the facing surface and the surface of the sample and preferably the projection assembly is arranged relative to the gap such that, where the light beam enters the gap, the light beam extends along most of the gap in a direction perpendicular to the facing surface.

Clause 23: The charged particle assessment system of any preceding clause, wherein a gap is defined between the facing surface and the surface of the sample and preferably a dimension of the gap in a direction across a path of the charged particle beam is at least 10, preferably at least 100, or more preferably at least 1000 times a dimension of the gap in a direction parallel to the path of the charged particle beam.

Clause 24: The charged particle assessment system of any preceding clause, wherein the charged particle-optical system comprises an objective lens assembly configured to focus the charged particle beam on the sample, the facing surface being a surface of the objective lens assembly.

Clause 25: The charged particle assessment system of any proceeding clause, wherein the light beam comprises coherent light, preferably the light source is a laser so that the light beam is a laser beam.

Clause 26: A charged particle assessment system comprising: a sample holder configured to hold a sample having a surface; and a charged particle-optical device configured to project a charged particle beam towards the sample, the charged particle beam having a field of view corresponding to a portion of the surface of the sample, the charged particle-optical device having a facing surface facing the sample holder; wherein the facing surface comprises a topographical region facing the portion, the topographical region having a surface topography so as to reflect an obliquely incident light beam towards the portion.

Clause 27: A method of operating a charged particle assessment system, comprising: holding a sample in a sample holder; projecting a charged particle beam towards the sample using a charged particle-optical device, the charged particle beam having a field of view corresponding to a portion of a surface of the sample, the charged particle-optical device having a facing surface facing the sample; and directing a light beam along a light path using a projection assembly such that the light beam reflects off the facing surface up-beam, with respect to the light path, of being incident on the portion. Desirably the light beam reflects off the facing surface at least twice.

Clause 28: The method of clause 27, wherein the directing comprises controlling the light beam by controlling the projection assembly.

Clause 29: A charged particle assessment system comprising: a sample holder configured to hold a sample having a surface; a charged particle-optical device configured to project a charged particle beam towards the sample, the charged particle beam having a field of view corresponding to a portion of the surface of the sample, the charged particle-optical device having a facing surface facing the sample holder; and a projection assembly arranged to direct a light beam along a light path between the optical system and the sample holder so as to be incident on the portion of the sample surface and such that along the path the light beam reflects off the facing surface.

While the present invention has been described in connection with various embodiments, other embodiments of the invention will be apparent to those skilled in the art from consideration of the specification and practice of the technology disclosed herein. It is intended that the specification and examples be considered as exemplary only, with a true scope and spirit of the invention being indicated by the following claims and clauses set out herein.

The descriptions above are intended to be illustrative, not limiting. Thus, it will be apparent to one skilled in the art that modifications may be made as described without departing from the scope of the claims set out below and the clauses set out herein.

The invention claimed is:

1. A charged particle assessment system, comprising:

a sample holder configured to hold a sample having a surface;

a charged particle-optical device configured to project a charged particle beam towards the sample, the charged particle beam having a field of view corresponding to a portion of the surface of the sample, the charged particle-optical device having a facing surface facing the sample holder; and a projection assembly arranged to direct a light beam along a light path such that the light beam reflects:

off the surface of the sample up-beam, with respect to the light path, of reflecting off the facing surface; and at least twice off the facing surface up-beam, with respect to the light path, of being incident on the portion of the surface of the sample.

2. The charged particle assessment system of claim 1, wherein the light beam when incident on the portion of the surface of the sample at least covers the portion of the surface of the sample corresponding to the field of view of the charged particle beam.

3. The charged particle assessment system of claim 1, wherein the projection assembly comprises a light source configured to emit the light beam.

4. The charged particle assessment system of claim 1, wherein the projection assembly comprises an optical system configured to focus the light beam to be narrower in a direction perpendicular to the facing surface than in a direction parallel to the facing surface and perpendicular to an axis of the light beam.

5. The charged particle assessment system of claim 4, wherein:

the projection assembly is configured such that an axis angle of the light beam is greater than a focus angle of the light beam;

the axis angle is defined between a surface of the sample holder facing the charged particle-optical device and the axis of the light beam immediately up-beam of its entry between the charged particle-optical device and the sample holder; and the focus angle is defined as a taper angle of the light beam caused by the optical system focusing the light beam.

6. The charged particle assessment system of claim 1, wherein the facing surface comprises a surface topography to reflect the light beam towards the sample.

7. The charged particle assessment system of claim 6, wherein the surface topography comprises sawtooth shaped elements angled to reflect the light beam to the portion of the surface of the sample.

8. The charged particle assessment system of claim 6, wherein the projection assembly is positioned relative to the charged particle-optical device and the sample holder so that the projection assembly directs the light beam such that its most down-beam, with respect to the light path, reflection off the facing surface up-beam of being incident on the portion of the surface of the sample is at a topographical region facing the portion.

9. The charged particle assessment system of claim 6, wherein the facing surface comprises a scattering region, the surface topography of the scattering region being configured to scatter the light beam when reflecting the light beam towards the sample.

10. The charged particle assessment system of claim 9, wherein the projection assembly is positioned relative to the charged particle-optical device and the sample holder so that the projection assembly directs the light beam to reflect off the scattering region.

11. The charged particle assessment system of claim 10, wherein the scattering region faces at least the portion of the surface of the sample.

12. The charged particle assessment system of claim 1, comprising a detector configured to detect signal particles emitted by the sample.

13. The charged particle assessment system of claim 12, wherein the surface facing the sample holder is comprised at least in part by the detector.

14. The charged particle assessment system of claim 1, wherein:

the light beam comprises coherent light; and the projection assembly comprises a laser light source, wherein the light beam is a laser beam.

15. The charged particle assessment system of claim 1, wherein the facing surface is planar.

16. The charged particle assessment system of claim 1, wherein the facing surface is a surface of the electron-optical device most proximate to the sample holder.

17. A method of operating a charged particle assessment system, comprising:

holding a sample in a sample holder;

projecting a charged particle beam towards the sample using a charged particle-optical device, the charged particle beam having a field of view corresponding to a portion of a surface of the sample, the charged particle-optical device having a facing surface facing the sample; and directing a light beam along a light path using a projection assembly such that the light beam reflects:

off the surface of the sample up-beam, with respect to the light path, of reflecting off the facing surface; and at least twice off the facing surface up-beam, with respect to the light path, of being incident on the portion of the surface of the sample.

18. The method of claim 17, wherein the directing comprises controlling the light beam by controlling the projection assembly.

19. A charged particle assessment system, comprising:

a sample holder configured to hold a sample having a surface;

a charged particle-optical device configured to project a charged particle beam towards the sample, the charged particle beam having a field of view corresponding to a portion of the surface of the sample, the charged particle-optical device having a facing surface facing the sample holder; and a projection assembly arranged to direct a light beam along a light path between an optical system and the sample holder to be incident on the portion of the sample surface and such that along the light path, the light beam reflects:

off the surface of the sample up-beam, with respect to the light path, of reflecting off the facing surface; and off the facing surface at least twice up-beam, with respect to the light path, of being incident on the portion of the surface of the sample.

* * * * *